(12) United States Patent
Takashima

(10) Patent No.: US 8,792,266 B2
(45) Date of Patent: Jul. 29, 2014

(54) RESISTANCE-CHANGE TYPE NON-VOLATILE SEMICONDUCTOR MEMORY

(75) Inventor: Daisaburo Takashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/605,674

(22) Filed: Sep. 6, 2012

(65) Prior Publication Data

US 2013/0242638 A1    Sep. 19, 2013

(30) Foreign Application Priority Data

Mar. 16, 2012 (JP) ................. P2012-061185

(51) Int. Cl.
*G11C 11/00* (2006.01)
*G11C 13/00* (2006.01)
(52) U.S. Cl.
CPC .................... *G11C 13/0069* (2013.01)
USPC ........................... 365/148; 365/163
(58) Field of Classification Search
CPC . G11C 13/0069; G11C 13/0004; G11C 11/16
USPC ........................... 365/148, 163, 158
See application file for complete search history.

(56) References Cited

U.S. PATENT DOCUMENTS

| 5,894,447 | A | 4/1999 | Takashima |
| 7,505,307 | B2 | 3/2009 | Ueda |
| 7,773,405 | B2 | 8/2010 | Sakimura et al. |
| 2008/0316798 | A1 * | 12/2008 | Tanizaki et al. ............... 365/148 |

FOREIGN PATENT DOCUMENTS

| JP | 2004-348934 | 12/2004 |
| JP | 2009-277273 | 11/2009 |

OTHER PUBLICATIONS

Kenji Tsuchida et al., A 64Mb MRAM with Clamped-Reference and Adequate-Reference Schemes, ISSCC 2010/Session 14/Non-Volatile Memory/14.2, 2010 IEEE International Solid-State Circuits Conference, 3 pages.

Noboru Sakimura et al., A 250-MHz 1-Mbit Embedded MRAM Macro Using 2T1MTJ Cell with Bitline Separation and Half-Pitch Shift Architecture, IEEE Asian Solid-State Circuits Conference, Nov. 12-14, 2007/Jeju, Korea, pp. 216-219.

* cited by examiner

*Primary Examiner* — Huan Hoang
(74) *Attorney, Agent, or Firm* — Patterson & Sheridan LLP

(57) ABSTRACT

A memory cell is formed with a resistance variable element, which is interposed between first and second electrodes and can store resistance changes representing 2 or more different values, and first and second cell transistors having source terminals thereof connected to the first electrode, and gates thereof to a word line. A drain of the first cell transistor is connected to a bit line, and a drain of the second cell transistor is connected to a data line. The second electrode is connected to a source line. During a read operation, the first and second cell transistors are kept in an ON state, and a current is supplied from the bit line to the source line through the memory cell. Data is read according to the electrical potential difference between the data line and the source line.

21 Claims, 36 Drawing Sheets

Read Operation

Write Operation #1

Write Operation #2

Fig. 27

| Type of Memory | Circuit Diagram | Characteristics | Structure & Material |
|---|---|---|---|
| Phase Change Memory (PRAM) | | R=High, Low | $Ge_2Sb_2Te_5$ (GST) Heater |
| Resistive RAM (RRAM) | BL—WL—SL | R=High, Low | NiO, WOx, HfO$_2$, ZnO$_2$, TiON, PrCaMnO, Ag-GeSe, Cu-GeSe, TaOx, FeO, GeO, STO, CuSiO |
| Magnetoresistive RAM (MRAM) | | R=High, Low | Cap / CoFeB / MgO / CoFeB/Ru/CoFeB / PtMn |
| Ferroelectric RAM (FeRAM) | BL—WL—PL | Q=High, Low | IrO$_2$ / SrRuO$_3$ / PbZr$_x$Ti$_{1-x}$O$_3$ (PZT) / Ir |

SPIN-INJECTION MAGNETIZATION-REVERSAL TYPE MRAM

Parallel(P)    Anti-Parallel(AP)

RESISTANCE-CHANGE TYPE NON-VOLATILE SEMICONDUCTOR MEMORY

CROSS-REFERENCE TO RELATED APPLICATION

This application is based upon and claims the benefit of priority from Japanese Patent Application No. 2012-061185, filed Mar. 16, 2012; the entire contents of which are incorporated herein by reference.

FIELD

Embodiments described herein relate to a resistance-change type non-volatile semiconductor memory.

BACKGROUND

A conventional non-volatile resistance-change type semiconductor memory employs a memory element, whose resistance changes under different conditions, to store data.

DESCRIPTION OF THE DRAWINGS

FIG. 27 shows the types and features of conventional resistance-change type non-volatile memory.

DETAILED DESCRIPTION

Figure 1:
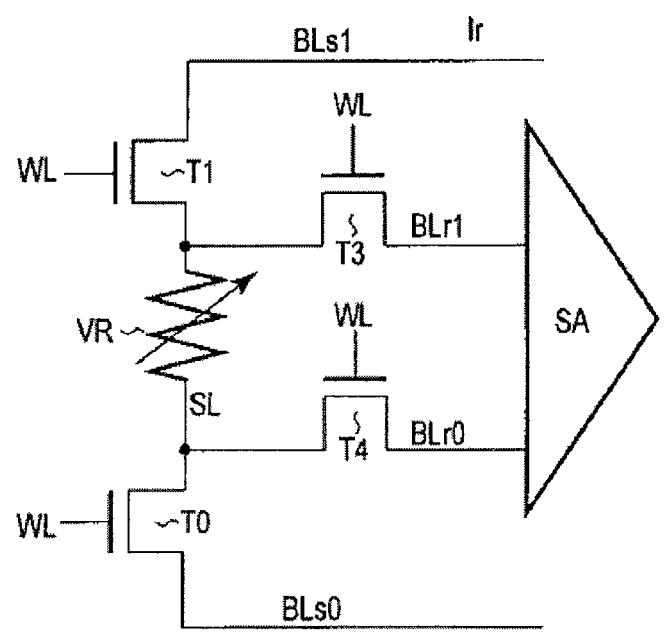
FIG. 1 shows a four-terminal reading method.

In general, before showing embodiments of this invention using the illustrations as references, a general concept is shown in FIG. 1. FIG. 1 shows a simplified example in which a four-terminal measuring method is applied to a resistance change memory.

Embodiments disclosed herein provide a resistance-change type non-volatile semiconductor memory that can enhance operational reliability.

A resistance-change type non-volatile semiconductor memory according to an embodiment has a first electrode and a second electrode, a resistance-change element, which is interposed between the first and second electrodes and can store resistance changes representing 2 or more different values, and first cell transistor and the second cell transistor; one memory cell is formed by connecting the source terminal of the first cell transistor and the source terminal of the second cell transistor to the first electrode; the gate terminal of the second cell transistor is connected to a word line; the drain terminal of the first cell transistor is connected to a bit line; the drain terminal of the second cell transistor is connected to a data line; the second electrode of the resistance-change element is connected to a source line; a memory cell array is constructed by positioning these units; and during a read operation from the memory cell, it keeps the first and second cell transistors in the ON state, supplies a current from the bit line to the source line through the memory cell and reads the data written in the memory cell, from the electrical potential difference between the data line and the source line.

As shown in FIG. 1, this device supplies a current between bit lines BLs 0 and BLs 1, and reads the electrical potential of a cell resistance-change element VR, through another path: BLr 0 and BLr 1. At this time, it blocks a current from flowing to the sense amp (SA). In this way, a current will flow to cell transistors T1 and T0 on the side of the BLs 1 and BLs 0. Even if a voltage difference between the source and the drain of these transistors T1 and T0 fluctuates, since there is no current on the side of BLr 1 and BLr 0, the voltage difference between the cell resistance-change elements can be read without being affected. However, in this example, four cell transistors T0 through T3 will be necessary for each cell, making the cell size large.

Figure 2:
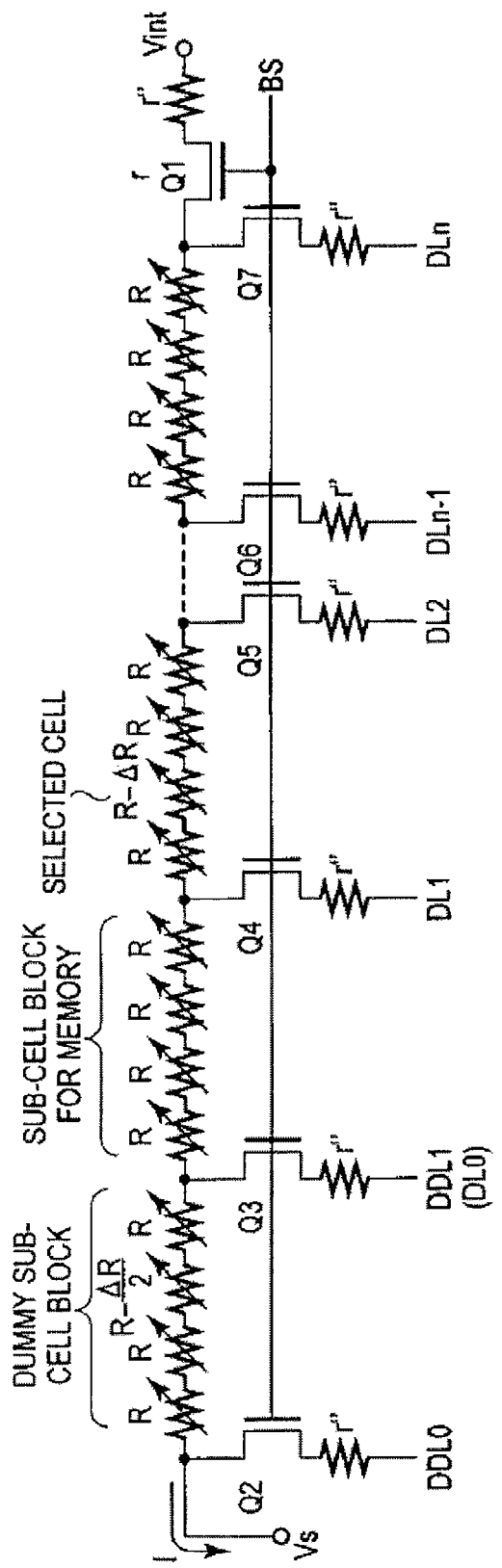
FIG. 2 shows a conventional MRAM reading operation.

FIG. 2 shows a design that resolved this problem. It employs a method in which a current is supplied between Vint-Vss, and the voltage is read from the DLi lines. However, in order to reduce the number of transistors for each cell, it is necessary to connect the cells in series. As a result, the design is not useful for memories which operate at low voltages.

Figure 3:
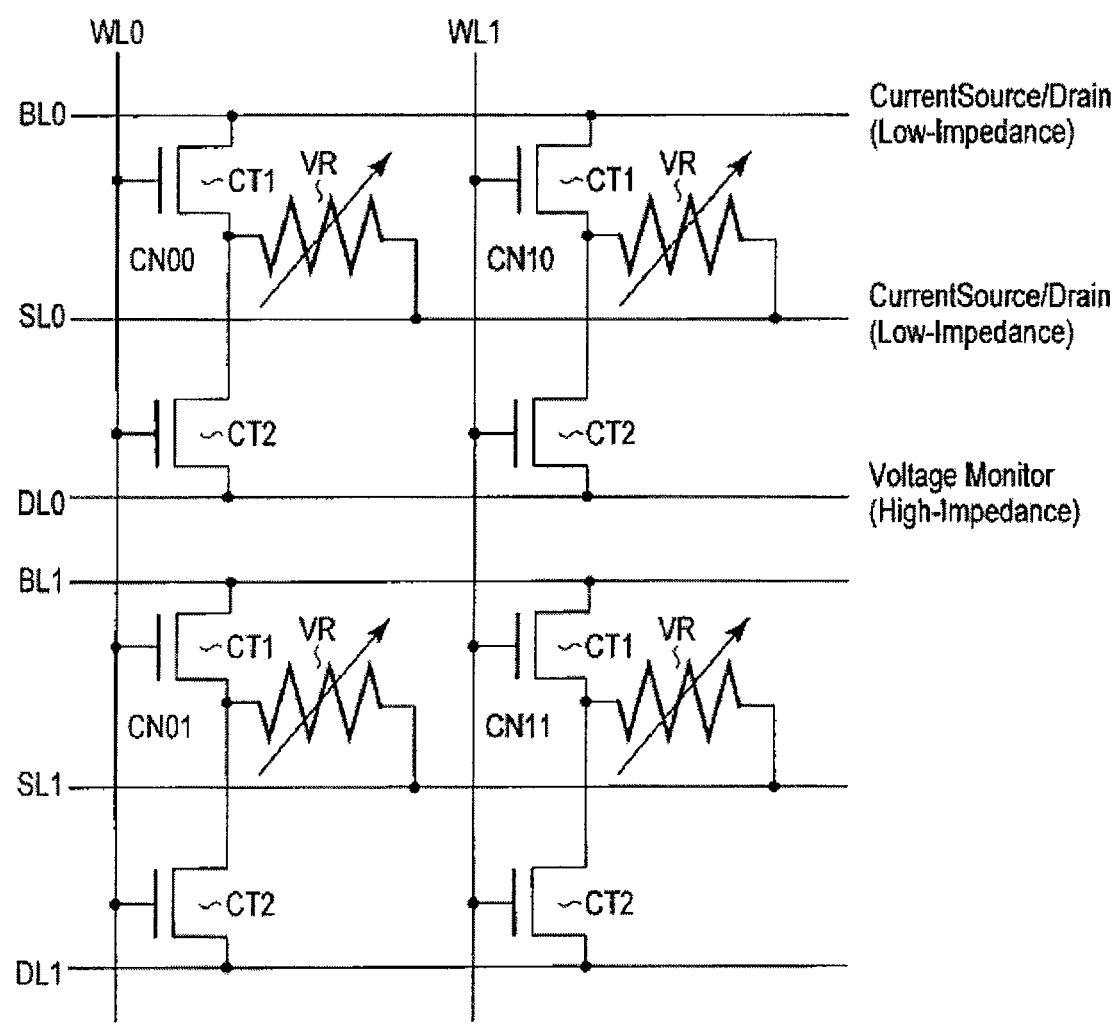
FIG. 3 is a circuit map of a memory cell array according to a first embodiment.

FIG. 3 shows a 2×2 memory cell according to a first embodiment.

One end of the resistance-change element VR is connected to a source line SL and the other end is connected to a bit line BL through a first cell transistor CT1, and to a data line DL through a second cell transistor CT2. The gates of the first and second cell transistors CT1 and CT2 are connected to a word line WL. This example shows a case in which the source line SL is positioned in parallel with the data line DL and the bit line BL. During a read operation, a current is supplied between the bit line BL and the source line SL and then an electric potential between the data line DL and the source line SL is read. In this way, even if the current flowing through the first cell transistor CT1 fluctuates and a voltage difference between the source and the drain of the cell transistor CT1 fluctuates, the data line DL will not be affected and a correct voltage will be read in the data line DL. Thus, even if the electrical characteristics of the cell transistor fluctuates, or the wiring resistance of the bit line BL fluctuates due to the positioning of the cell array or process fluctuations, a correct resistance value of the cell resistance-change element VR can be read from the data line DL when the current is supplied. It should also be noted that the data line DL is in the high impedance state; therefore, even if the resistance of the cell transistor CT2 fluctuates, a voltage drop across the cell transistor CT2 will not change. Because of this, not only can original characteristics of the cell resistance-change element VR be read correctly, but also fluctuations in resistance in the first and second cell transistors CT1 and CT2 can be ignored. The sizes of the cell transistors CT1 and CT2 can thus be reduced and the reduction of the overall cell size also becomes possible.

Figure 4:
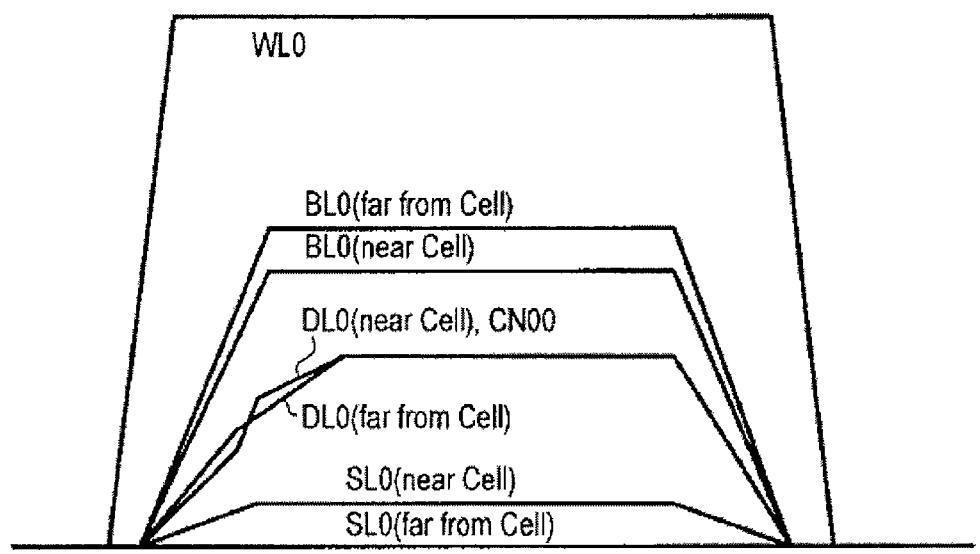
FIG. 4 shows an operational example of the first embodiment.

In FIG. 4, an example waveform during the read operation is shown. This example shows a case in which WL0 is selected, and data in cell CN00 is read. When WL0 is selected and a current is supplied to BL0, because of parasitic resistance of BL0, the electric potential of BL0 near the cell ("BL0 (near Cell)") in FIG. 4) will drop vis-à-vis the electric potential at the driving source of BL0 ("BL0 (far from Cell)" in FIG. 4). Furthermore, a voltage difference is also generated between the source and the drain of the first cell transistor CT1 ((BL0 (near Cell)–CN00) in the illustration). This parasitic resistance changes depending on the location of the bit line with respect to the cell, and fluctuations also occur. The voltage difference between the source and the drain of the first cell transistor CT1 also fluctuates. On the other hand, when the electric potential of CN00 is read in the data line DL0 through the second transistor CT2, by not connecting DL0 to a current source but simply using it as an input to an amplifier circuit, a current will temporarily flow initially, until the electric potential is stabilized, but eventually there will be no current. Thus, even if the resistance of the first cell transistor CT1 exists, and the parasitic resistance exists in DL0, there will be no voltage drop (in FIG. 4, "DL0 (near Cell)" and "DL0 (far from Cell)" have the same electric potential). This is how fluctuating influences by the BL0 line and the first cell transistor CT1 can be completely eliminated, and a voltage which is generated purely in the resistance-change element VR can be read from DL0. Similarly in this case, because of the parasitic resistance of the source line SL, the electric potential increases as it approaches the cell from the driving source. In this example, as an exception, the influence of this voltage increase appears as noise, increasing the electric potential of the cell CN00. However, as a whole, such noise is significantly reduced compared to conventional models.

The write operation is performed by changing the level of voltage applied between the bit line BL and the source line SL, or by changing the polarity of the voltage. In this case, too, it is possible to control and feedback the voltage difference between the bit line BL and the source line SL so that the electric potential between the data line DL and the source line SL can be monitored so that a constant write voltage can be applied to the cell. In this way, there will be no fluctuations during the write voltage, and the margin between the write voltage and the dielectric breakdown voltage can be maintained. Also, because there are no fluctuations in the write voltage, fluctuations in the writing speed can be reduced.

Figure 5:
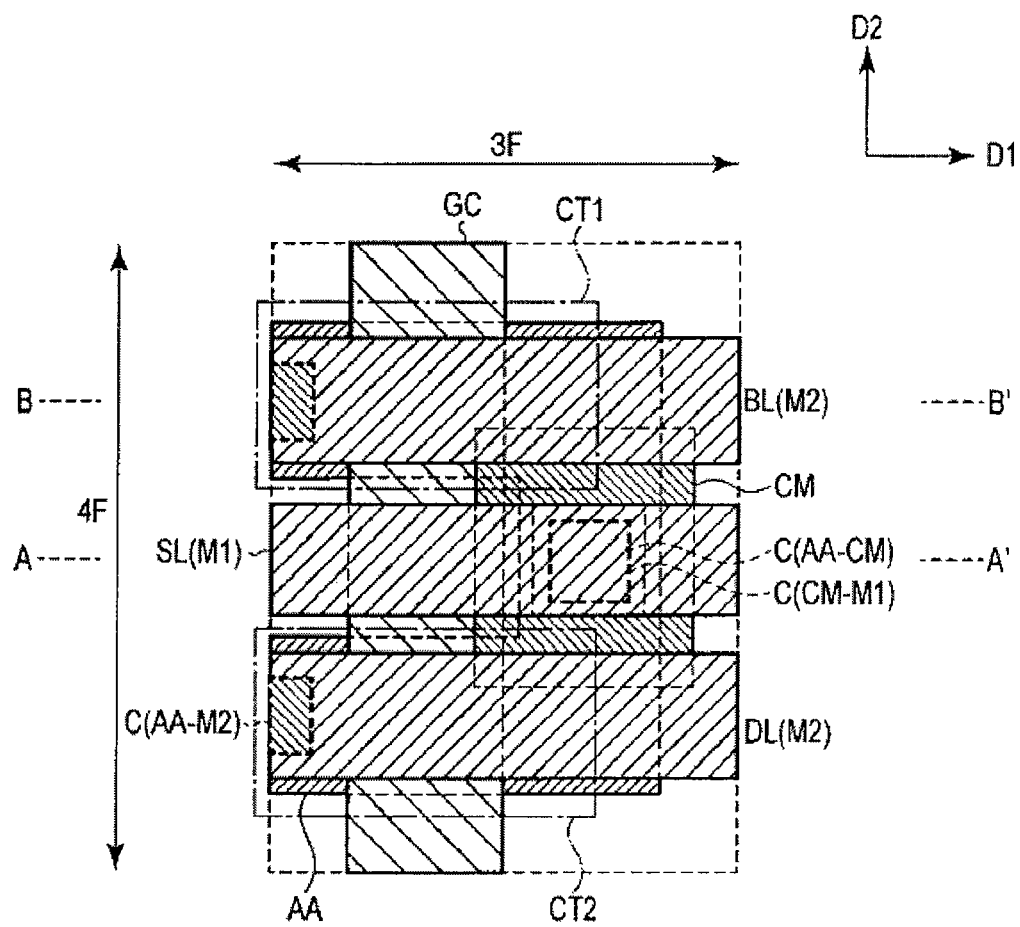
FIG. 5 shows a plan view of the memory cell of the first embodiment.
Figure 6:
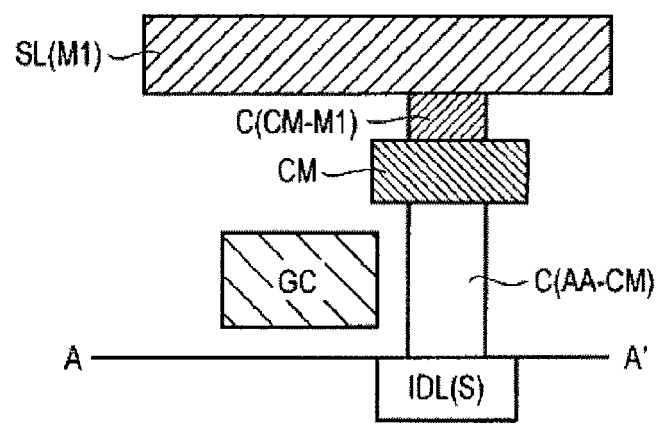
FIG. 6 shows a cross section of the memory cell of the first embodiment.
Figure 7:
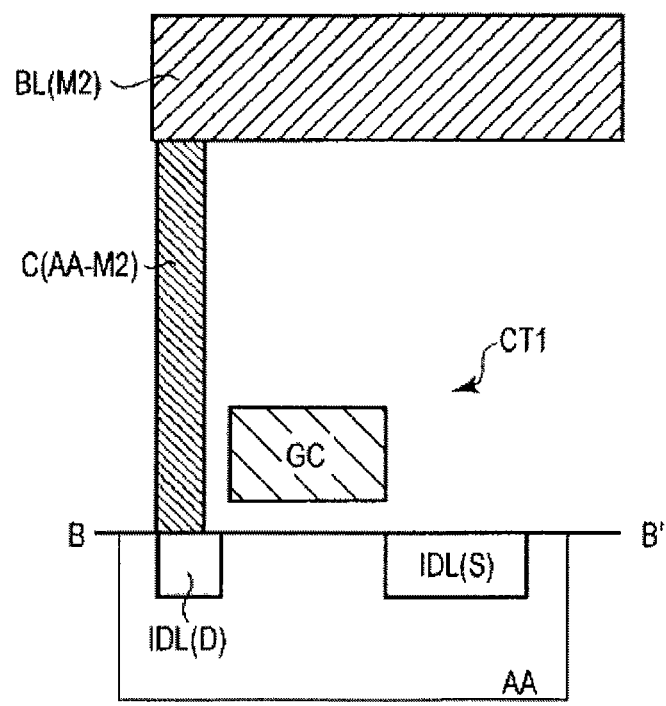
FIG. 7 shows a cross section of the memory cell of the first embodiment.

FIG. 5 through FIG. 7 show a layout of the memory cell, or an example of the cell configuration. FIG. 5 is a plan view that shows a layout of the cell. FIG. 6 and FIG. 7 show cross sections along A-A' and at B-B' lines in FIG. 5, respectively. If L/S (line and space) of the wire are F and F respectively, a small cell having a size of 12 $F^2$, with a length of 3 F in the direction of the word line GC, and 4 F in the direction of the bit line, can be embodied. The bottom electrode of a cell resistance material CM (corresponding to VR in FIG. 3) is connected to the first and second cell transistors CT1 and CT2 through contact with element regions AA. The transistors CT1, CT2 are connected to the bit line BL and the data line DL through contact with the metal wiring in the second layer M2. The top electrode of the cell resistance material CM is connected to the wiring M1, which is the source line SL, through contact with the metal wiring in the first layer M1.

To be more specific, as shown in FIG. 5, two element regions AA in a rectangular shape along the first direction D1 are positioned in parallel. An element isolation region is formed around the element region. A word line GC is formed across the two element regions AA, along the second direction D2, which is perpendicular to the first direction D1. Within the element region AA, an impurity diffusion layer IDL is formed, which functions as either a source region or a drain region. With these and the word line GC, the first and second cell transistors CT1 and CT2 are formed (see FIG. 6).

Also, an element region AA is formed in a semiconductor substrate by making a common connection between the sources of the first and second cell transistors CT1 and CT2. Within this region, an impurity diffusion layer IDL, which functions as the source region of the first and second cell transistors CT1 and CT2, is formed (see FIG. 4). Furthermore, a contact plug C (AA-CM) is formed on this region. On the contact plug C (AA-CM), a cell resistance material CM is formed. On the cell resistance material CM, a contact plug C (CM-M1) is formed. Further, the contact plug C (CM-M1) is connected to the source line SL, which is formed by the first layer of the metal wiring layers that extend along the first direction D1. Also, the drain region of the first cell transistor CT1 and the drain region of the second cell transistor CT2 are connected respectively to the bit line BL and the data line DL, which are formed by the second layer of the metal wiring layers extending along the first direction D1, through a corresponding contact plug C (AA-M2).

Figure 8:
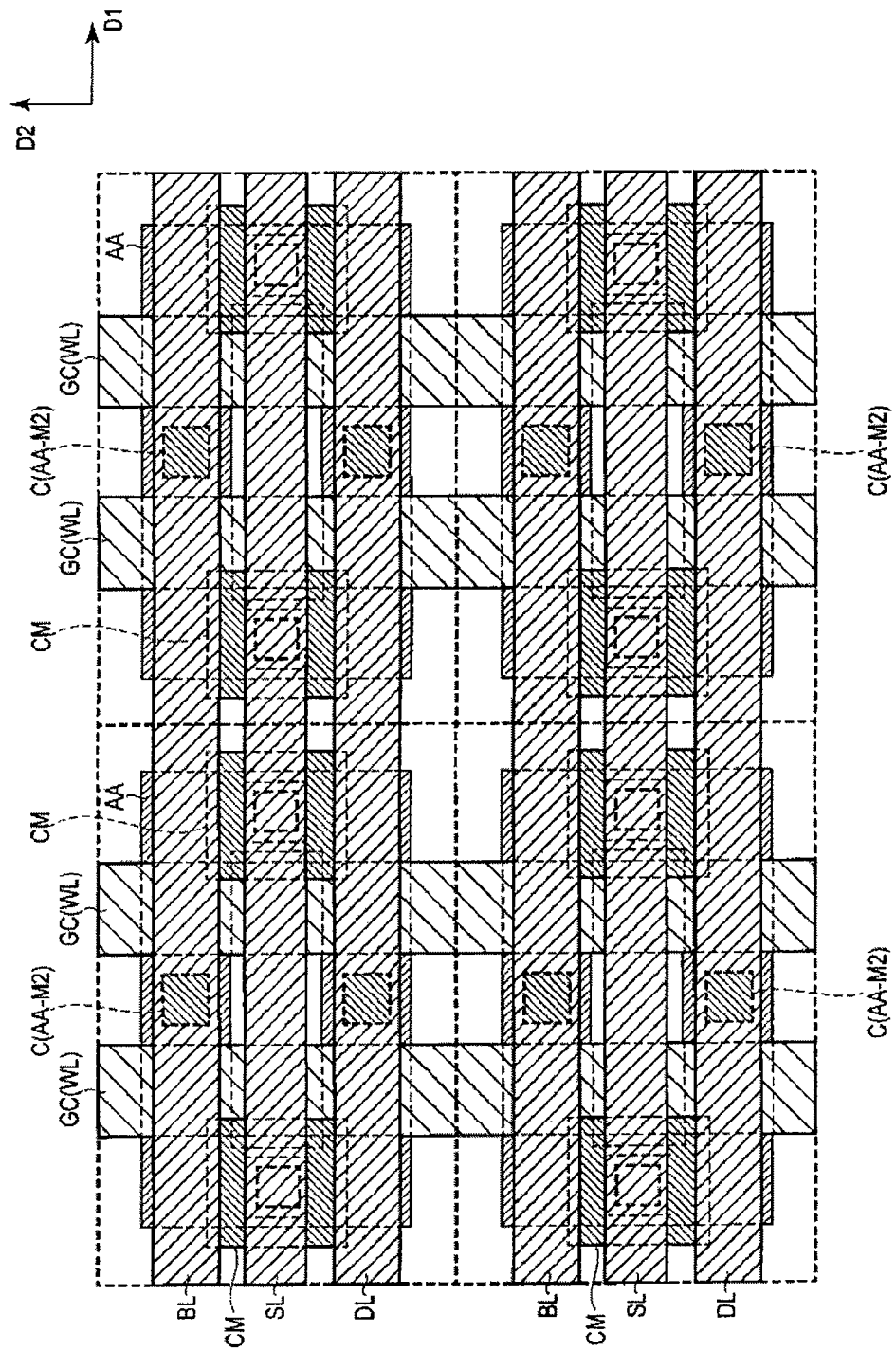
FIG. 8 shows a plan view of the memory cell array of the first embodiment.

FIG. 8 shows a layout of the memory cell, or an example of the cell structure, according to the first embodiment. This example shows a case in which four cells in FIG. 5 through FIG. 7 are lined up. The contact C between M2 and AA (AA-M2) can be shared by the left and right cells.

Figure 9:
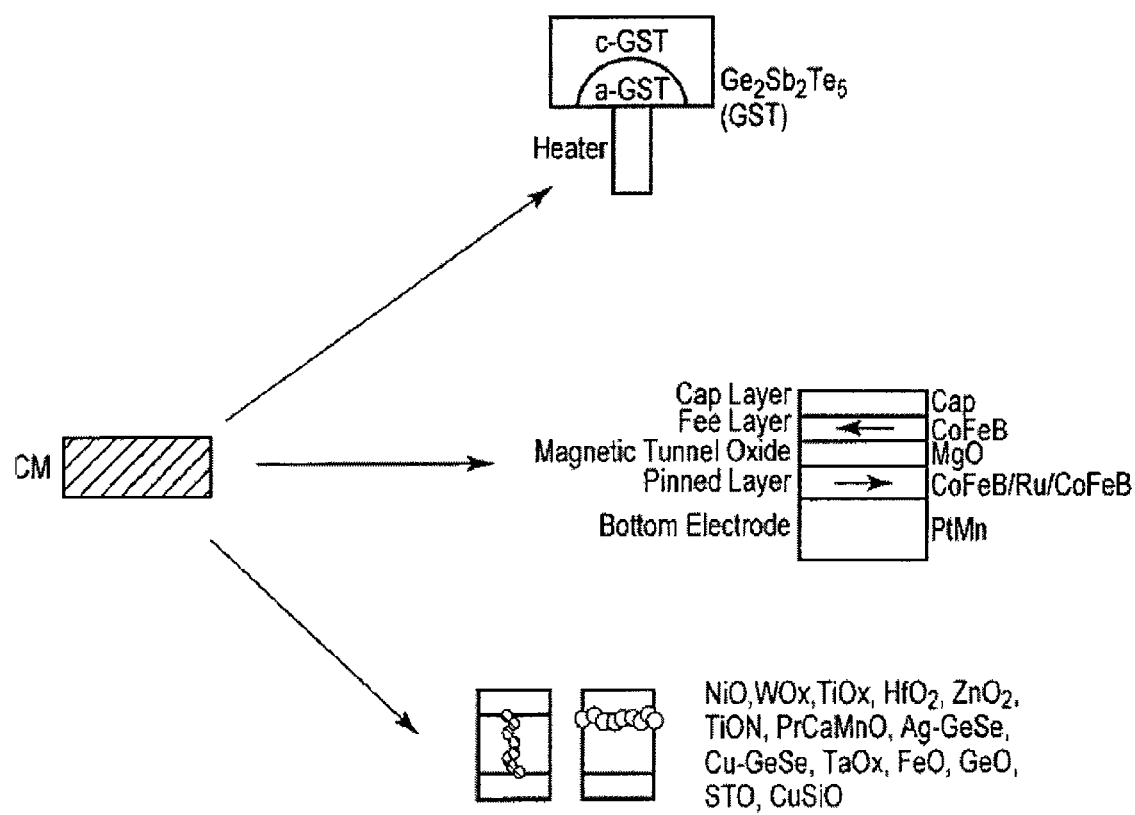
FIG. 9 shows types of memory cell applicable to the first embodiment.

FIG. 9 shows memory structures applicable to the cell resistance change material CM in FIG. 3 and FIG. 5 through 8, and examples of their materials. The configurations explained in FIG. 3 and FIG. 5 through FIG. 8 can be applied to a phase change memory made of chalcogenide materials, which uses Ge, Sb, Te, and so on. It can also be applied to a spin-transfer torque type magnetic memory, in which a magnetic tunnel film is interposed between magnetic materials. It can also be applied to a resistance change memory with a structure in which binary metallic oxides, ternary metallic oxides, chalcogenide materials into which metallic electrons are mixed, or perovskite oxides are interposed between metallic electrodes. As possible main materials, a configuration in which $TiO_x$, NiO, $WO_x$, $HfO_2$, $ZnO_2$, TiON, PrCaMnO, Ag—GeSe, Cu—GeSe, $TaO_x$, FeD, GeO, STO, CuSiO and so on are interposed between electrodes with the same or different metals, can be applied. It can be applied to all the elements whose resistance value changes due to the oxidization-reduction effect and the transfer of oxygen vacancy.

Figure 10:
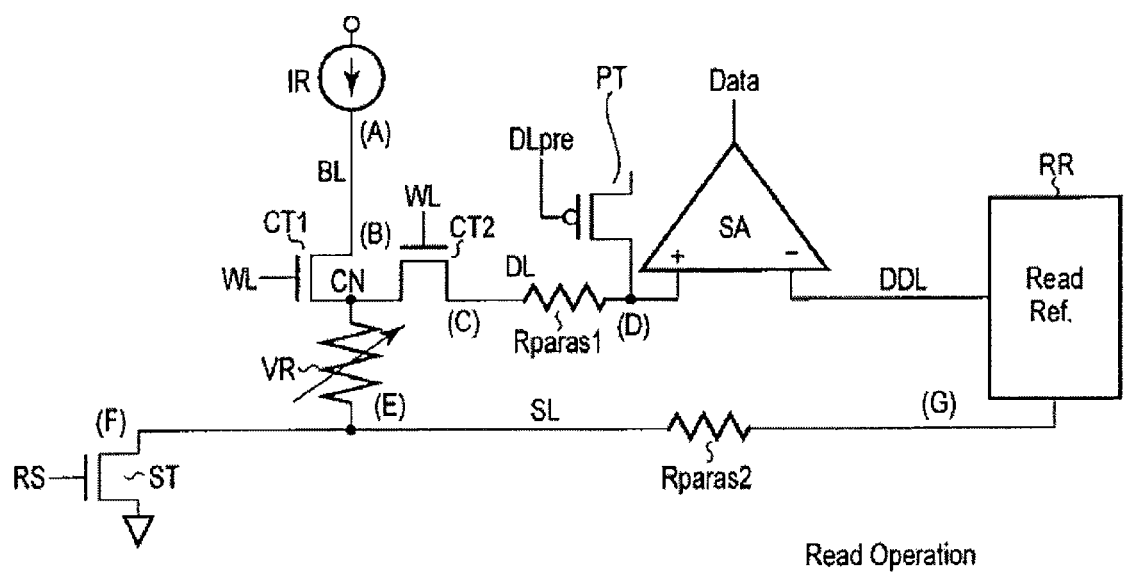
FIG. 10 shows the memory cell and its drive circuit of the first embodiment, and shows an equivalent circuit between the memory cell and the read circuit.

FIG. 10 shows a read operation, and shows an example of an equivalent circuit between the memory cell and its drive control circuit block. During the read operation, a current is supplied between the bit line BL and the source line SL to read the electrical potential between the data line DL and the source line SL. In this way, even if the resistance of the first cell transistor CT1, in which a current flows, fluctuates and the voltage difference between the source and the drain fluctuates, the data line DL will not be affected and a correct voltage can be read from the data line DL. Thus, even if the resistance of the cell transistors CT1 and CT2 fluctuates, or the wiring resistance of the bit line BL fluctuates due to the positioning of the cell array or process fluctuations, a correct resistance value of the resistance-change element of the cell (the voltage when current is supplied) can be read from the data line DL. At this time, the data line DL is in the high impedance state; therefore, even if the resistance of the cell transistor CT2 fluctuates, a voltage drop due to such resistance changes will not occur. Because of this, not only can original characteristics of the cell resistance-change element VR be read correctly, but also fluctuations in resistance of the first and second cell transistors CT1 and CT2 can be ignored. The sizes of the first and second cell transistors CT1 and CT2 can thus be reduced and the reduction of the cell size also becomes possible. At this time, a current flows into the source line SL at the left side of the cell, and a voltage drop occurs due to the resistance of the source line SL. However, in the source line SL at the right side of the cell, even if there is resistance, a voltage drop cannot be seen because the source line SL is in the high impedance state. Therefore, the electric potential can be read without being affected by the resistance of the data line DL and the source line SL, if a reference potential DDL in the reference circuit is compared with the electric potential of the data line DL, using this source line SL on the right side as a reference voltage when making a 0, 1 judgment. As a result, there will be no fluctuations by the cell transistors CT1 and CT2, nor a voltage drop of the signal lines. A correct voltage of the cell resistance-change element is thus read. This of course can limit the deterioration of cell signals; in addition, a reduction of the cell transistor size also becomes possible.

To be more specific, this embodiment is configured with a current source IR, a pre-charge transistor PT, a sense amp SA, a source line ground transistor ST, and a read reference circuit RR. A parasitic resistance Rparas1 exists in the data line DL, and a parasitic resistance Rparas2 exists in the source line SL between the resistance-change element VR and the reference circuit RR.

The current source IR provides the bit line BL with a current during the read operation. The reference circuit RR generates the electric potential DDL, which becomes the reference voltage during the read operation, using the electric potential of the source line SL as the reference voltage. This means that if the electric potential of the source line SL increases due to noise, the electric potential DDL will also increase by the corresponding value. The sense amp SA compares the reference potential DDL, which the reference circuit RR outputs, with the electric potential of the data line DL, and judges whether the data is 0 or 1 based on the comparison result. The transistor ST is controlled by the signal RS, and is kept in the ON state during the read operation of the data. The transistor PT is controlled by the signal DLpre, and pre-charges the data line DL to a specified electric potential during the initial stage of the read operation of the data.

Figure 11:
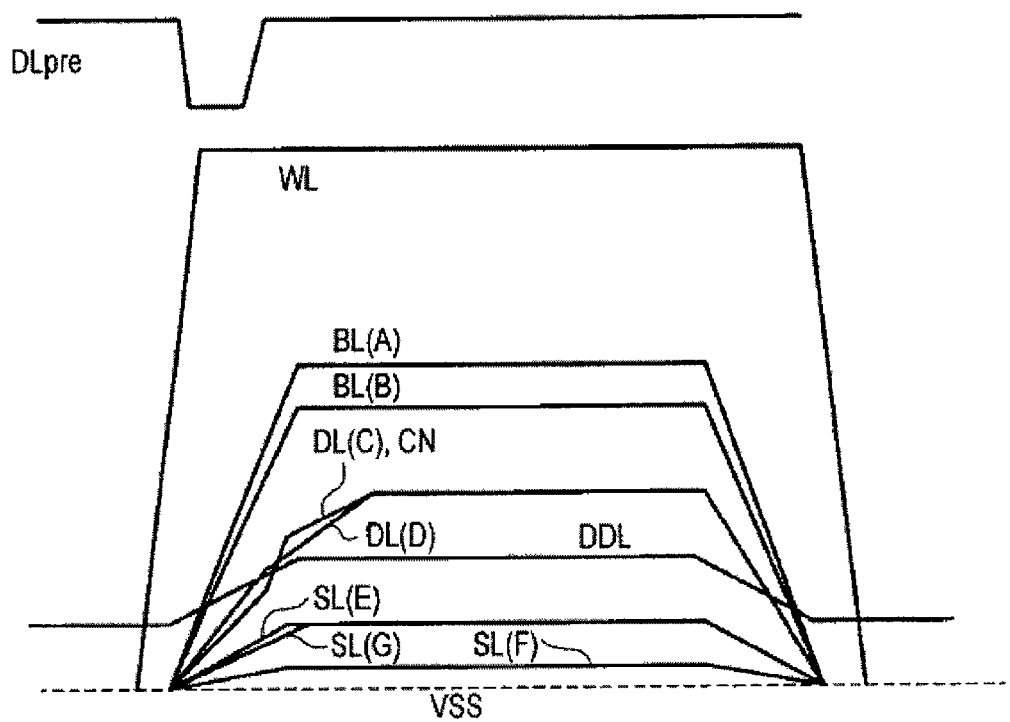
FIG. 11 shows an operational example of the first embodiment.

FIG. 11 shows an example waveform during this read operation. This example shows WL being selected and shows a case in which the data in the cell CN is read. When WL is selected and a current is supplied to the bit line BL, the electrical potential of the bit line BL near the cell (B) will decrease vis-à-vis the electric potential (A) of the current drive source due to the parasitic resistance of the bit line BL. Furthermore, a voltage drop also occurs at the first cell transistor CT1 between the source and the drain (see (B)-(CN) in FIG. 10). This parasitic resistance changes depending on the location, and fluctuations also occur. Also, the voltage drop at the first cell transistor CT1 between the source and the drain fluctuates. On the other hand, when the electric potential of CN is read in the data line DL through the second transistor CT2, because the current source IR is not connected to the data line DL but is simply input to the amplifier circuit SA, a current will temporarily flow initially until the electric potential is stabilized, but ultimately there will be no current. Thus, even though the resistance of the first cell transistor CT1 exists, there will be no electric potential difference between CN and (C). Also, even though a parasitic resistance Rparas1 exists at the data line DL, a voltage drop (C)-(D) will not occur. In this way, an effect from resistance fluctuations of the bit line BL and the first cell transistor CT1 can be completely eliminated, which is why only the voltage which is generated purely at the resistance-change element VR can be read in the data line DL. Similarly in this example, due to a parasitic resistance of the source line S1, the electrical potential will increase to be higher near the cell (E) than at the drive source (F). However, in the part of the selected cell, for example, if a current is driven from the array on the left side and the voltage of the source line is read by the array on the right side, since the right side is in the high-impedance state, the voltage will not drop. Thus, it becomes possible that the electric potential difference between the cell terminal (E) and the right terminal of the source line (G) will not be present except during the transitional period. Using the electrical potential of this terminal (G) as a reference voltage, if the electrical potential of the DDL line, which will become the reference voltage for the signal judgment of the read electric potential, is generated, and the judgment for the 0, 1 data is executed according to the size of the voltages of DL and DDL, the voltage drops of the source line SL, the data line DL, the bit line BL, and the first and second cell transistors CT1 and CT2 can be all eliminated, and it becomes possible to read only the voltage difference between the two terminals of the resistance element VR of the cell. The effect of noise can thus be eliminated. Here, since only a branch current from the bit line BL transiently flows into the data line until it is stabilized, in some cases, it may take a long time before the electrical potential of the data line DL is stabilized. However, if the electrical potential of the data line DL is pre-charged to some degree to a level near that of the cell signals by keeping the DLpre signal at a low level for a specified period during the initial stage of the access, the time necessary for the stabilization can be reduced significantly.

Figure 12:
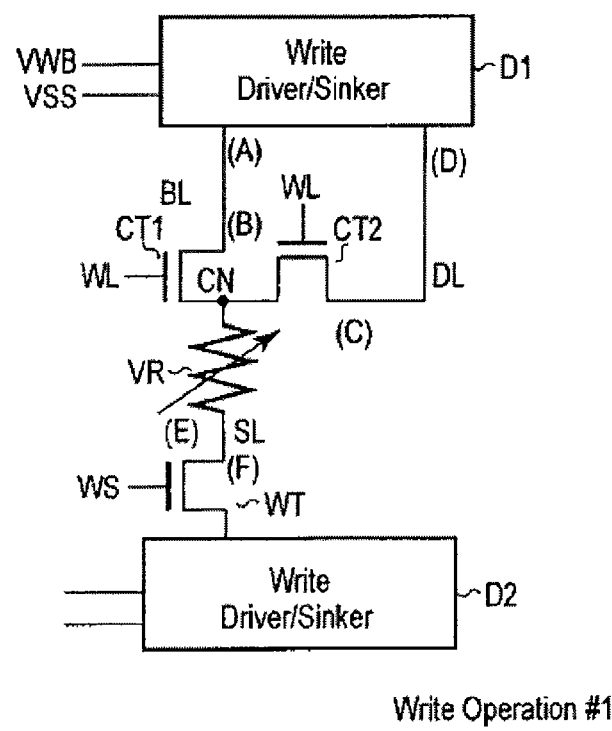
FIG. 12 shows the memory cell and its drive circuit of the first embodiment, as well as an equivalent circuit between the memory cell and the write circuit.
Figure 13:
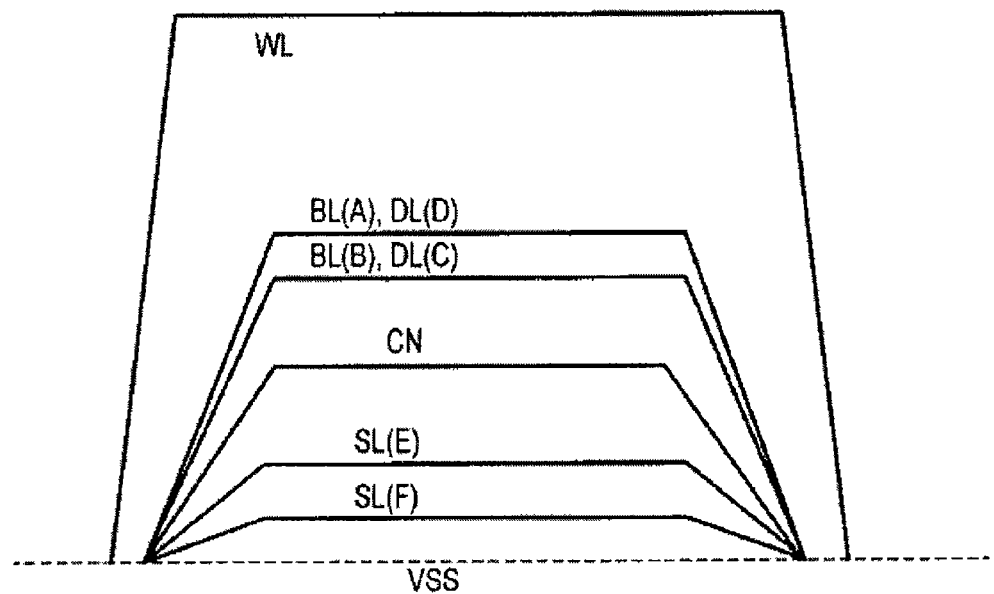
FIG. 13 shows an operational example of the first embodiment.

FIG. 12 shows an example of a write operation. FIG. 13 shows example waveforms associated with the write operation. The write operation is executed by changing the voltage applied between the bit line BL and the source line SL, or changing the polarity of the applied voltage. In this example, not only the bit line BL but also the data line DL, which is used during the read operation, are also used as write lines. The drive currents of two cell transistors—the first and second cell transistors CT1 and CT2—cause the current flow through the cell transistors. In this way, more current will flow during the write operation than the read operation, thus stabilizing the current. Of course, as FIG. 13 shows, in the bit line BL and the data line DL, the voltage drops at positions (B) and (C), which is near the cell, vis-à-vis positions (A) and (D), which is near the drive circuit D1, due to an effect of the parasitic resistance. However, compared to a case in which a current is driven through either the cell transistor CT1 or the cell transistor CT2, the voltage drop is smaller. However, in this case, the voltage drop (E)-(F) due to the parasitic resistance of the source line SL will remain.

To be more specific, this embodiment is configured with write drivers (sinkers) D1 and D2, and a write transistor WT. The transistor WT is controlled by a signal WS, and connects the source line SL to the driver D2 during the write operation. The driver D1 is connected to the bit line BL and the data line DL.

In some cases, the driver D1 becomes a current source and provides the bit line BL and the data line DL with current. This provided current flows into the driver D2 through the resistance-change element VR and the source line SL. In other cases, the driver D2 becomes a current source and provides the source line SL with a current. This provided current flows into the driver D1 through the resistance-change element VR and the bit line BL and the data line DL.

Figure 14:
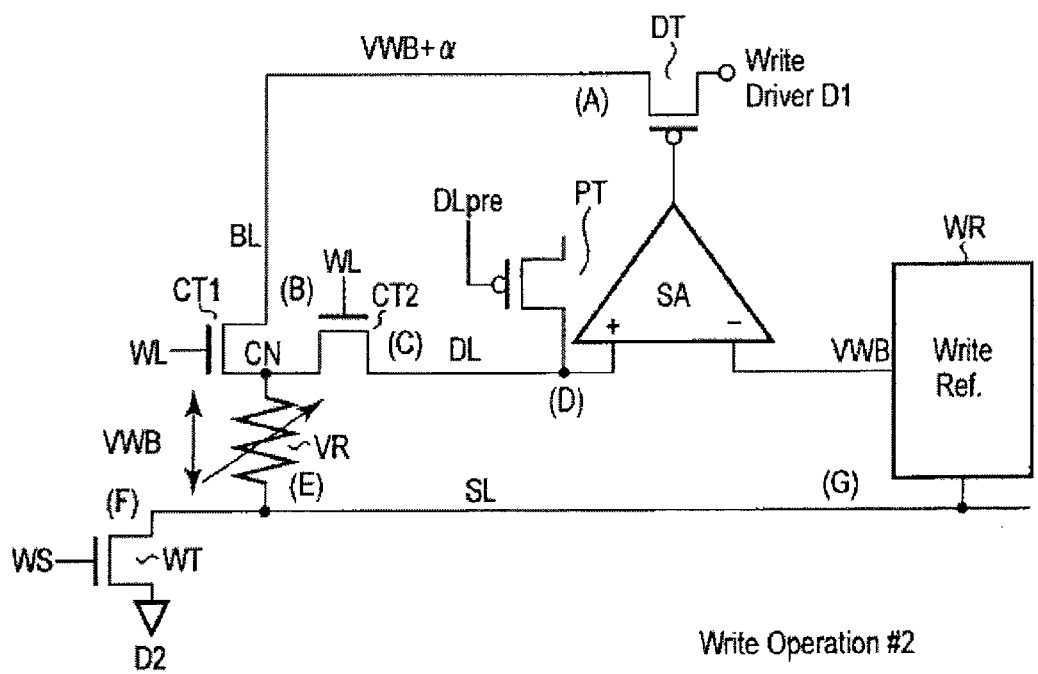
FIG. 14 shows the memory cell and its drive circuit of the first embodiment, as well as an equivalent circuit between the memory cell and the write circuit.
Figure 15:
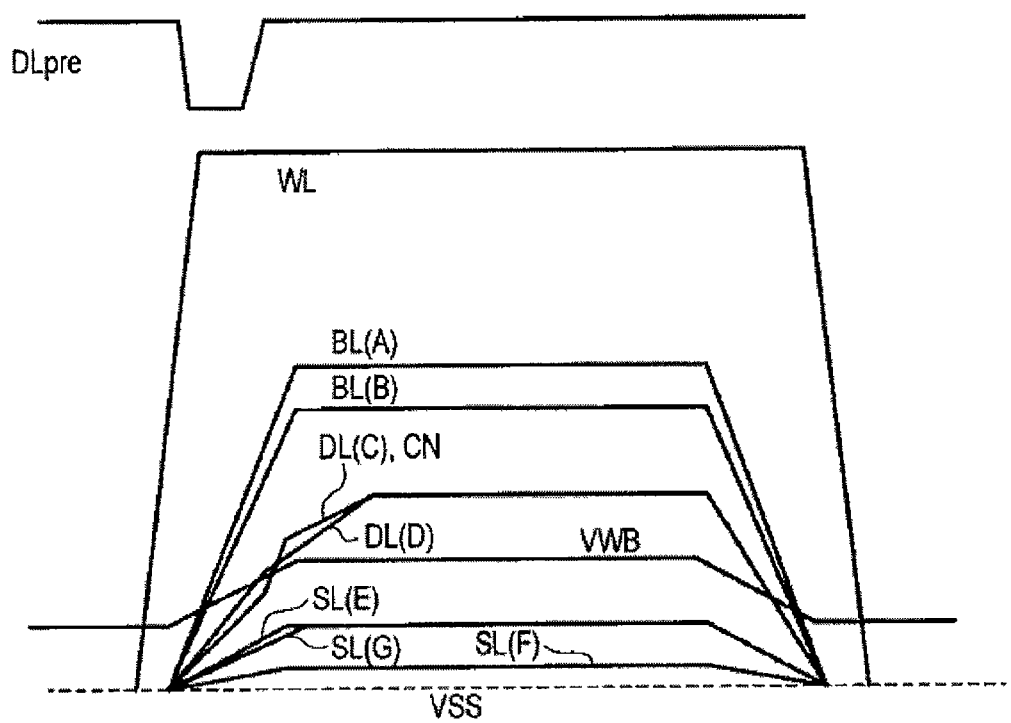
FIG. 15 shows an operational example of the first embodiment.

FIG. 14 shows another example of the write operation. The write operation writes data by changing the voltage applied between the bit line BL and the source line SL, or by changing the polarity of the applied voltage. The circuit of this example monitors the electrical potential between the data line DL and the source line SL, and can control and feedback the voltage difference between the bit line BL and the source line SL so that it can apply a specified write voltage to the cell. An operational example is shown in FIG. 15. In particular, the voltage of the cell resistance element VR is read from the source line SL and the data line DL, which are in the high-impedance state. This voltage is then compared with that of a circuit that generates the necessary write voltage VWB, using the source line SL as the reference voltage. If the data line voltage is too small, the Pch electric potential of the write driver D1 is decreased and the electric potential of the bit line BL is increased. As a result, the desired VWB can be applied to the cell resistance-change element VR.

At this time, the write operation is the same as the read operation, except during the transient operational period, at the first cell transistor CT1, there will be no current in the data line DL and the source line SL in the paths to the right from the cell, so the voltage of the cell resistance element VR between the two terminals CN and (E) coincides with the electrical potential difference (D)-(G). If the voltage difference between VWB and (G) is kept constant, the write driver D1 operates to equalize the voltage difference between VWB and (G) to the voltage difference between (D) and (G), so a current will flow in the bit line from (A) toward (B) and CN, and the voltage will become stabilized. In other words, when the voltage CN-(E) becomes larger than a desired value, there will be a feedback so that the current in the write driver D1 is reduced and equilibrium is maintained. In this way, even if resistance exists in the first and second cell transistors CT1 and CT2, not to mention in the data line DL, the bit line BL and the source line SL, the circuit will operate in such a way that a constant write voltage is applied to the cell resistance element VR. Therefore, there will be no fluctuations in the write voltage, and the margin between the write voltage and the dielectric breakdown voltage can be better maintained. Also, since there are no fluctuations in the write voltage, fluctuations in the writing time can also be constrained. Here, also for the write operation, since the increase in voltage of the data line is slow, a pre-charge circuit is activated to speed up the operation.

Also, even if the voltage difference between the source and the drain of the first transistor CT1 is increased, such fluctuations in the transistor do not affect the cell resistance-change element VR. A bigger current can thus be supplied to the first cell transistor CT1, which makes it possible to reduce the size of the first cell transistor CT1 and reduce the cell size.

To be more specific, this embodiment, namely the configuration described in FIG. 12, is equipped with a pre-charge transistor PT, a sense amp SA, a driver control transistor DT, and a write reference circuit WR.

The write circuit WR generates the write voltage VWB, which is applied to both ends of the resistance-change element VR. The reference circuit WR generates the electric potential VWB, using the electric potential of the source line SL as the reference voltage. Thus, if the electric potential of the source line SL increases because of noise, the electric potential VWB will also increase by a corresponding amount. The sense amp SA compares the reference potential VWB, which is output by the reference circuit WR, with the electric potential of the data line DL, and based on the comparison result, controls the transistor DT. Thus, if the electric potential of the data line DL is smaller than VWB, it controls the electric potential of its gate so that the transistor DT can apply more current. The transistor PT is controlled by the signal DLpre, and at the initial stage of the data writing, it pre-charges the data line DL to a specified electric potential. In such configuration, the electric potential of the bit line BL is maintained at VWB+α; as a result, the electric potential VWB is applied to both ends of the variable resistance element VR.

Here, the same sense amp SA and the same transistor PT can be used during the read and write operations.

Figure 16:
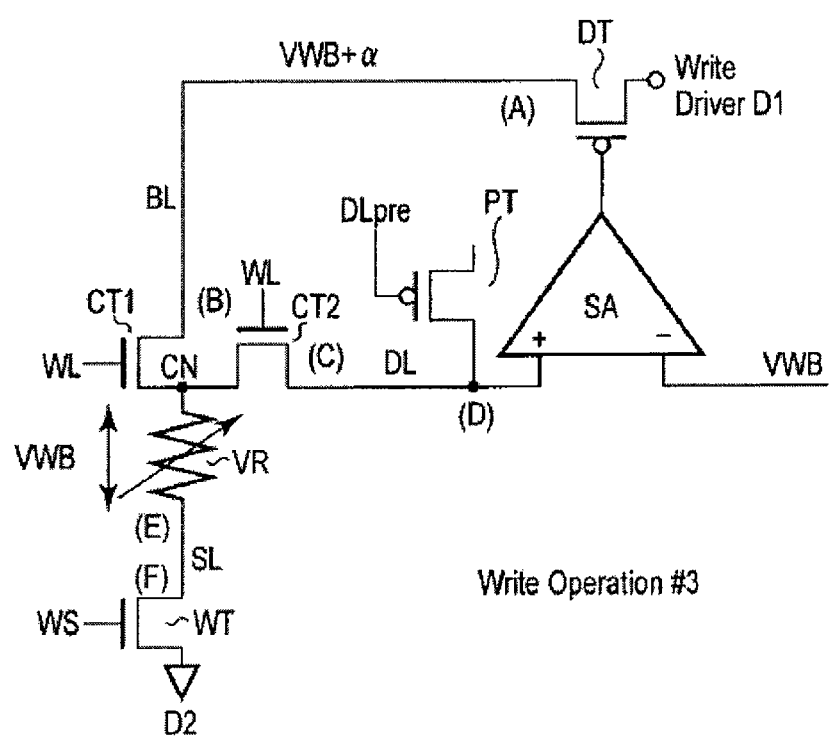
FIG. 16 shows an equivalent circuit between the memory cell and the write circuit of the first embodiment.
Figure 17:
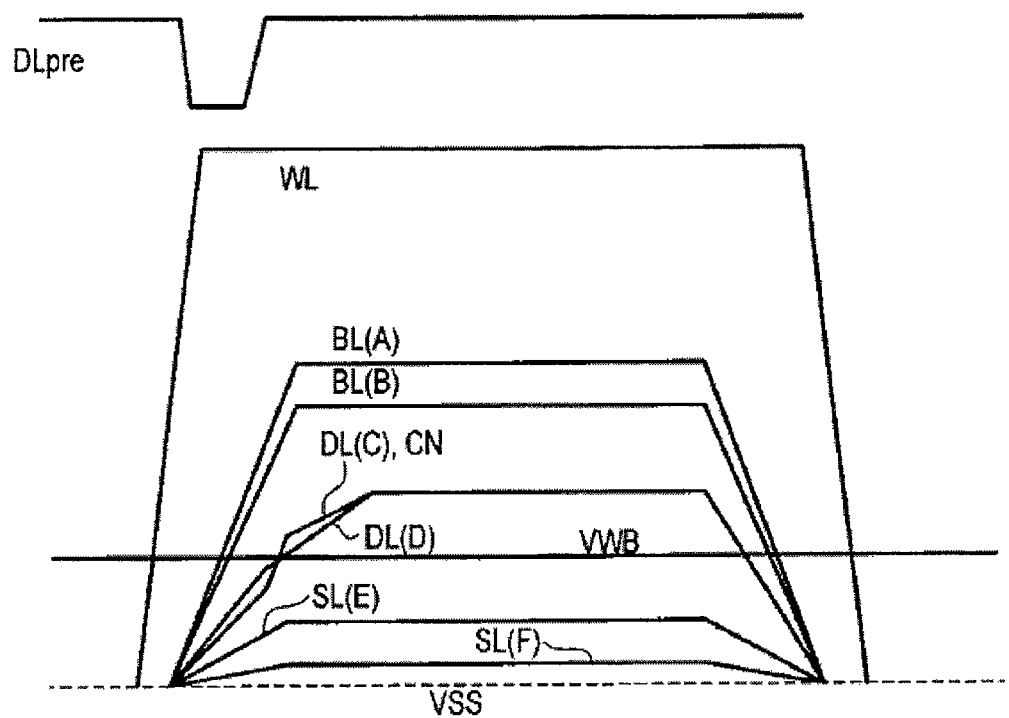
FIG. 17 shows an operational example of the first embodiment.

FIG. 16 shows another example of the write operation. FIG. 17 shows example waveforms associated with the write operation in FIG. 16. This example is more simplified than that of FIG. 14, and the circuit is made smaller. In this case, a voltage drop (E)-(F) occurs in the source line SL, but because voltage drops in other parts can be cancelled by feedback, an almost constant write voltage can be applied to the cell resistance element. The operation is substantially the same as that, in FIG. 14. The circuit compares the voltage in the data line DL directly with the necessary write voltage, and controls the voltage of the bit line BL so that a constant voltage can be applied to the cell resistance-change element.

Figure 18:
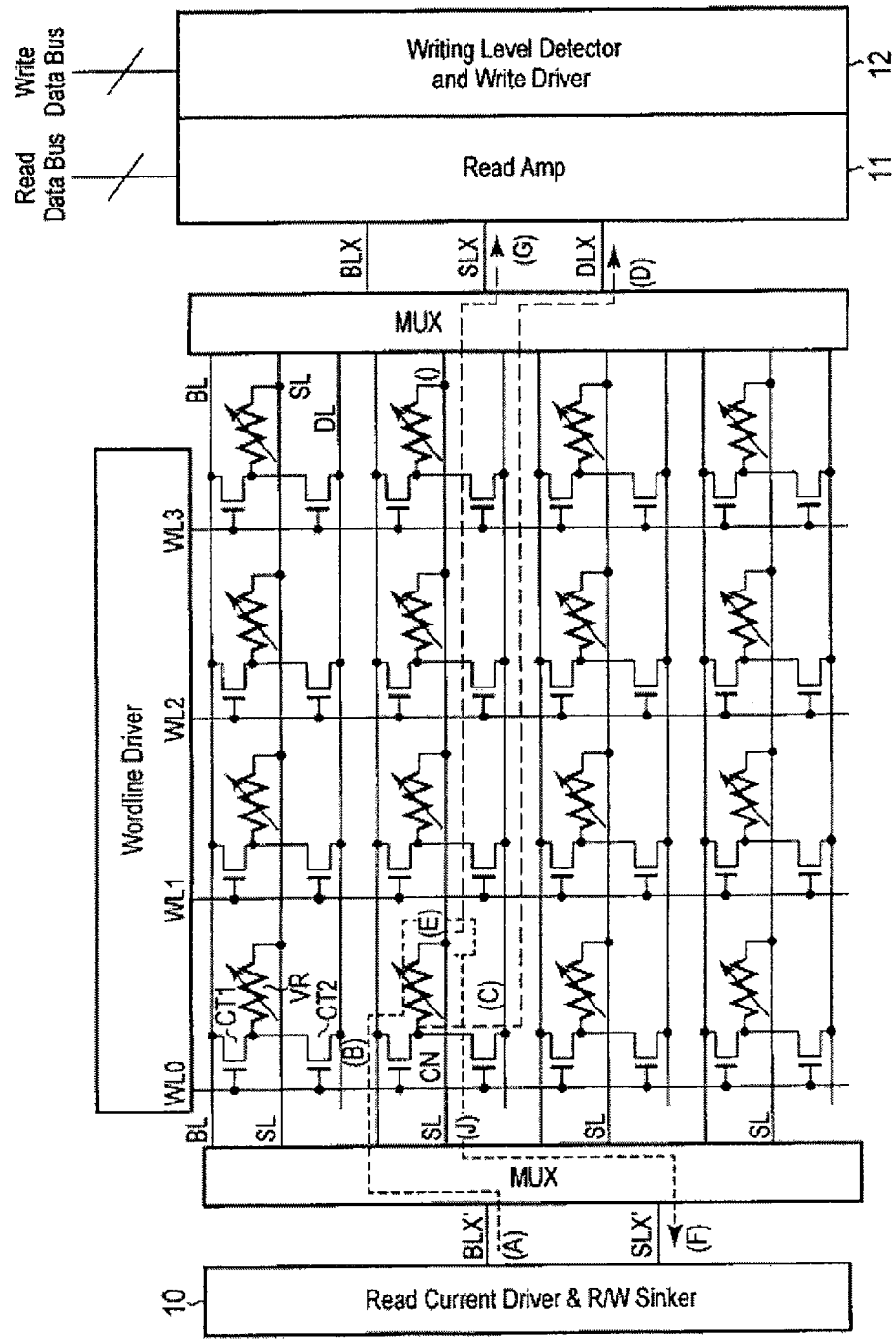
FIG. 18 shows a memory cell array and a control circuit block of the first embodiment.

FIG. 18 shows an example of the cell array and the control circuit. Multiplexer (MUX), which reads and writes by selecting one column from multiple columns, and driver, which supplies a current to the left side of the array during read, or sinker 10, which allows a current in, are positioned. In this way, the only path that a current flows during read is on the left side of the selected cell. The source line SL and the data line DL of the right side of the cell can be put in the high-impedance state. There will be no voltage drop from the wiring resistance. A correct voltage can thus be detected at read AMP 11 on the right end of the array.

In this example, the write level detector, which detects the voltage of the data line DL and the source line SL during write, and the write driver 12 are located on the right side of the array. Sinker is on the left side so, the same as read, and there will be no voltage drop, nor any effect due to fluctuations of the cell transistor. The voltage applied to the resistance-change element VR of the cell can thus be monitored, and the desired voltage of the bit line can be generated by feedback to the write driver 12. The waveform for read can be the same as in FIG. 11. The waveform for write can be the same as in FIG. 13, FIG. 15 or FIG. 17. The locations of the nodes (A), (B), (C), (D), (E), (F), (G) also coincide with those in FIG. 10, FIG. 12, FIG. 14, and FIG. 16. The differences are that in FIG. 18, the bit line BL, the source line SL and the data line DL are connected to an amp or a driver through a multiplexer, and that an amp or a driver is shared by multiple cells in the array, making it possible to reduce the area of these circuits. In this way, a voltage drop occurs due to the resistance component in the transistor of the multiplexer, but in this embodiment, since they are positioned in the paths of the bit line BL, the source line SL, and the data line DL, voltage fluctuations due to resistance can be cancelled.

Figure 19:
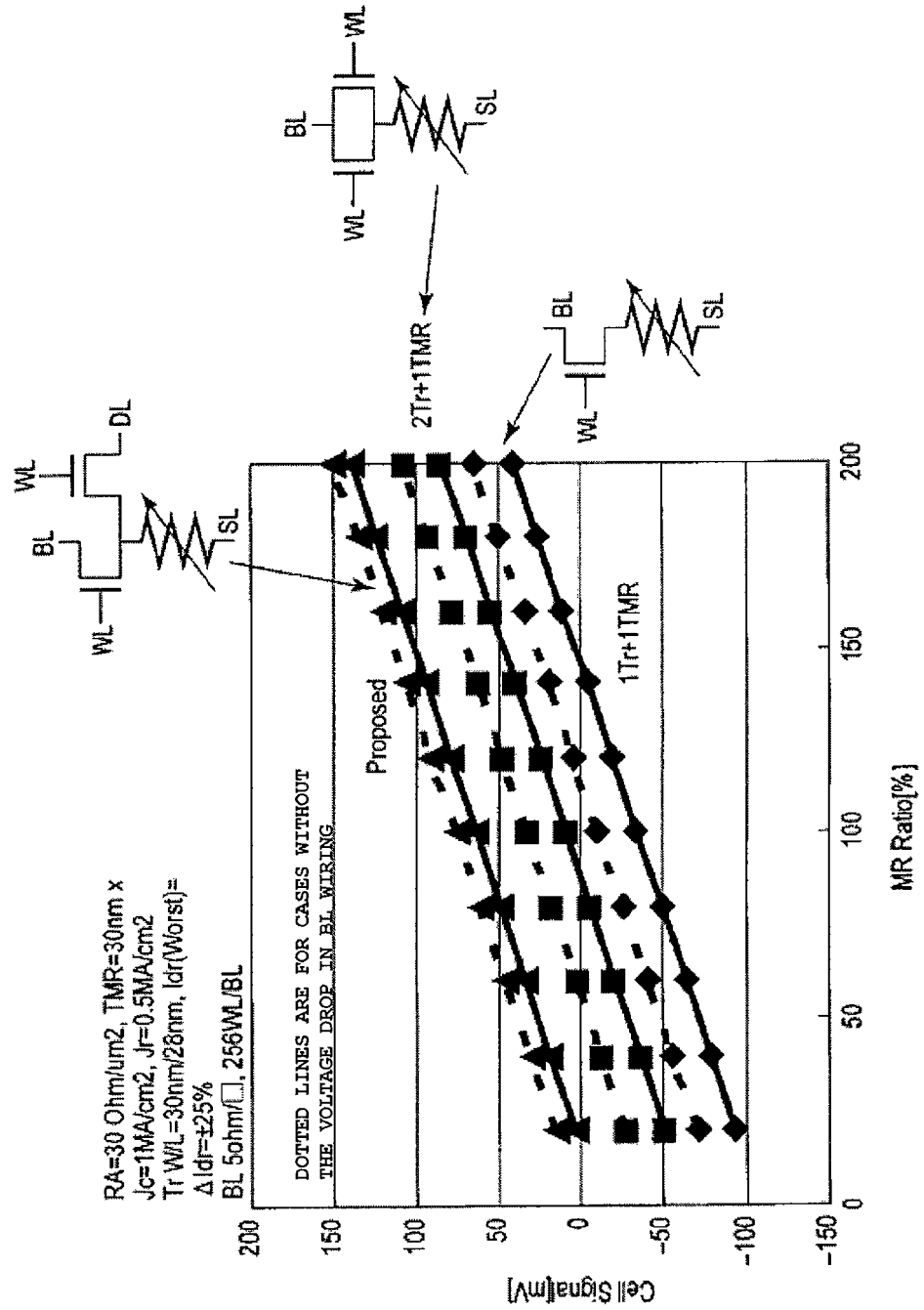
FIG. 19 shows an effect of the first embodiment.
Figure 20:
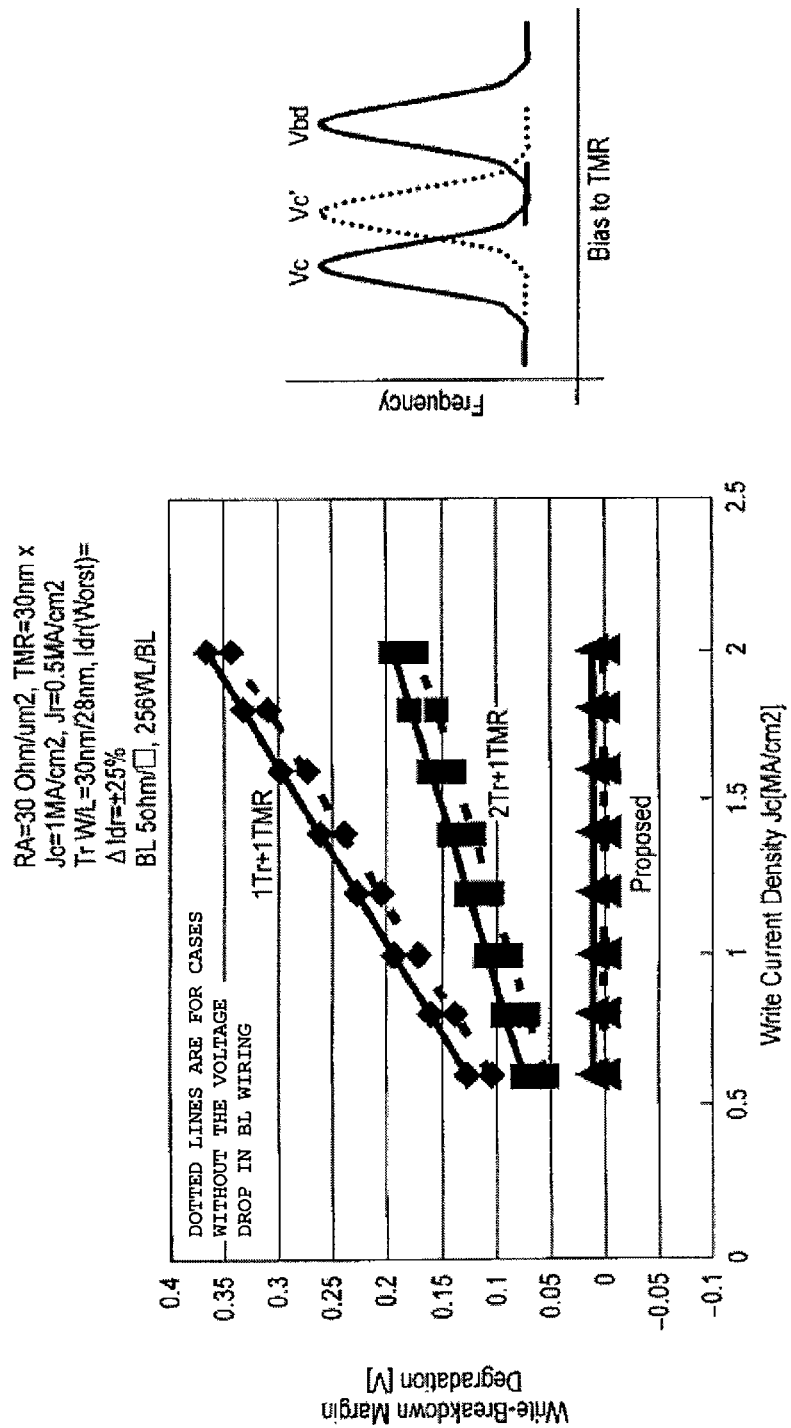
FIG. 20 shows an effect of the first embodiment.
Figure 21:
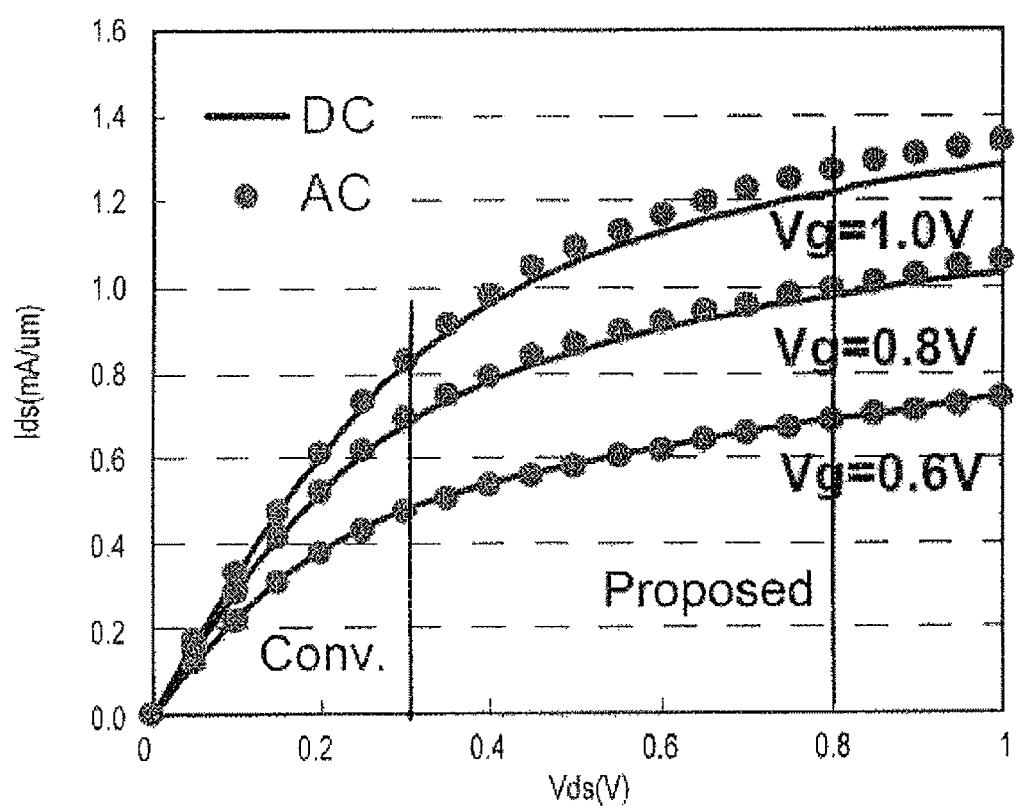
FIG. 21 shows an effect of the first embodiment.

FIG. 19 through FIG. 21 show the effects of this embodiment.

FIG. 19 compares conventional cases with one cell transistor and with two transistors, with that of this embodiment regarding the cell's resistance change ratio MR, cell fluctuations at that time, and cell signals after the wiring resistance voltage drop. Straight lines show cases that ignore (without) the wiring resistance voltage drop, while dotted lines show cases that account for (with) the wiring resistance voltage drop.

In the two conventional cases, even if the effects of the wiring resistance voltage drop is ignored, the signal deterioration due to fluctuations of the cell transistor is large. Even a cell signal of 50 mV cannot be obtained unless MR exceeds, in the case of one transistor, 200%, or in the case of two transistors, unless MR exceeds 100%. On the other hand, in the case of this embodiment, a cell signal of 50 mV can be obtained with MR=70%.

Similarly, FIG. 20 shows for the conventional cases with one transistor and with two transistors, as well as this embodiment, cell fluctuations in the necessary cell write current and the amount of deterioration of the margin between the breakdown voltage and voltage due to fluctuations in the write voltage caused by the wiring resistance voltage drop. This embodiment can eliminate the fluctuation of the write voltage with respect to the cell resistance-change element VR, so the deterioration of this margin is approximately 0 mV. In the conventional methods, as the write current increases, the source drain voltage of the cell transistor becomes larger. The effect from this fluctuation thus becomes larger, and the margin is lost.

Similarly, FIG. 21 shows for a conventional case with one cell transistor and this embodiment, the potential difference Vds, which can be applied between the source and the drain of the cell transistor. In the conventional method, when a large amount of current is supplied to the cell transistor, the voltage difference between the source and the drain becomes larger, and the effect of the fluctuation becomes large, so it is not possible to apply a large amount of current. On the other hand, in this embodiment, even if the amount of current is increased, there will be no effect by the fluctuation of the cell transistor. It is thus possible to apply a larger current by increasing the voltage difference between the source and the drain. In this way, a stabilization of the cell's operational margin and a smaller design for the cell transistor become possible.

Figure 22:
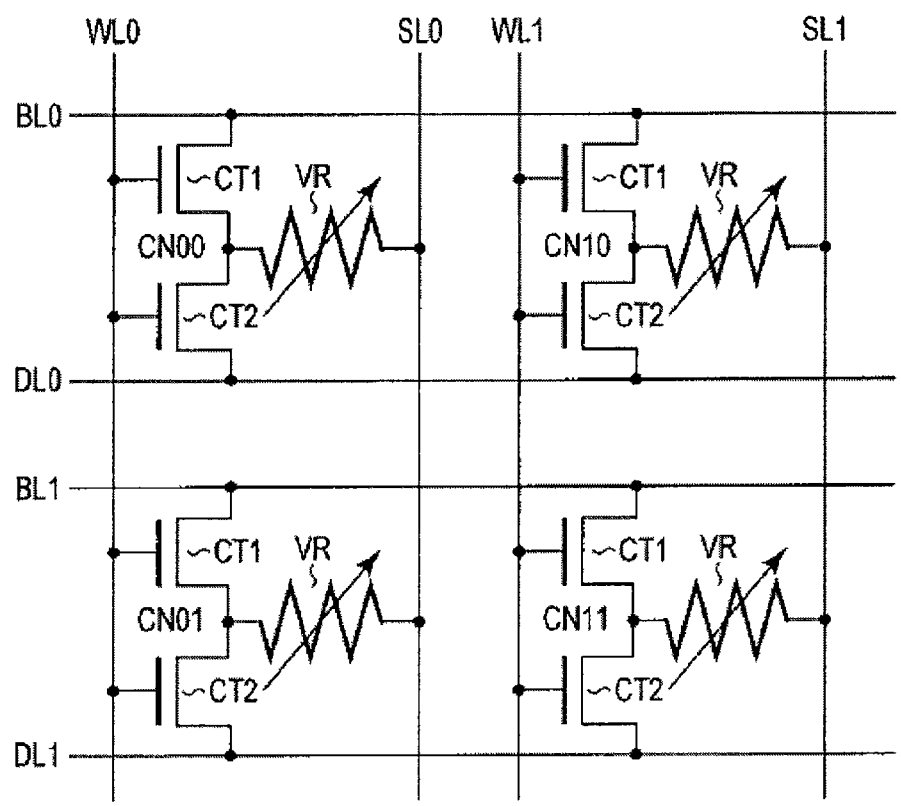
FIG. 22 shows a circuit map of a memory cell array according to a second embodiment.
Figure 23:
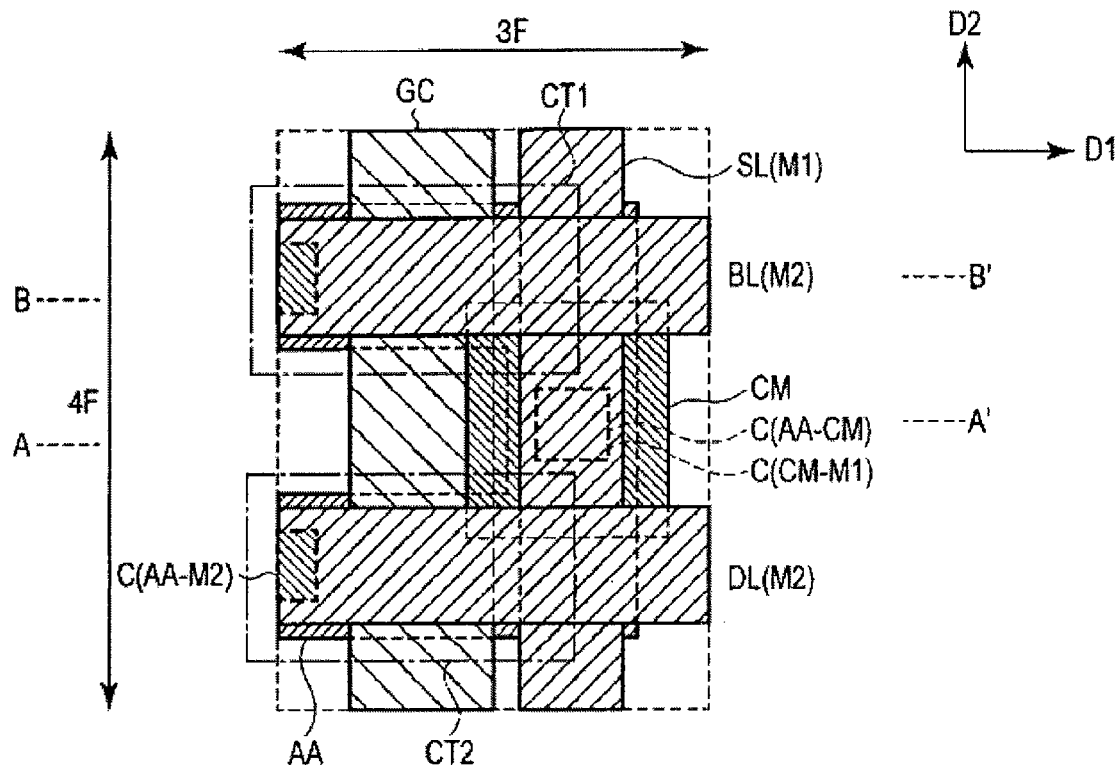
FIG. 23 shows a plan view of the memory cell of the second embodiment.
Figure 24:
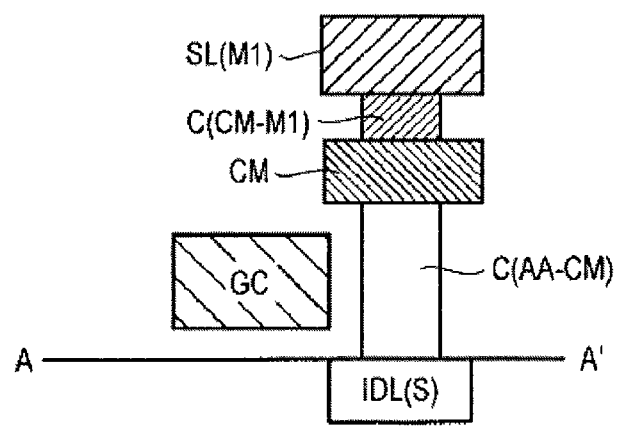
FIG. 24 shows a cross section of the memory cell of the second embodiment.
Figure 25:
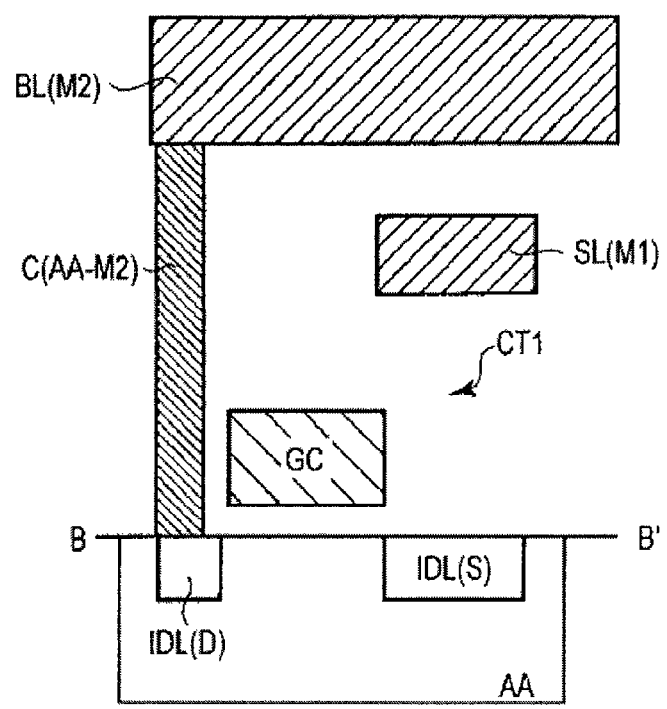
FIG. 25 shows a cross section of the memory cell of the second embodiment.
Figure 26:
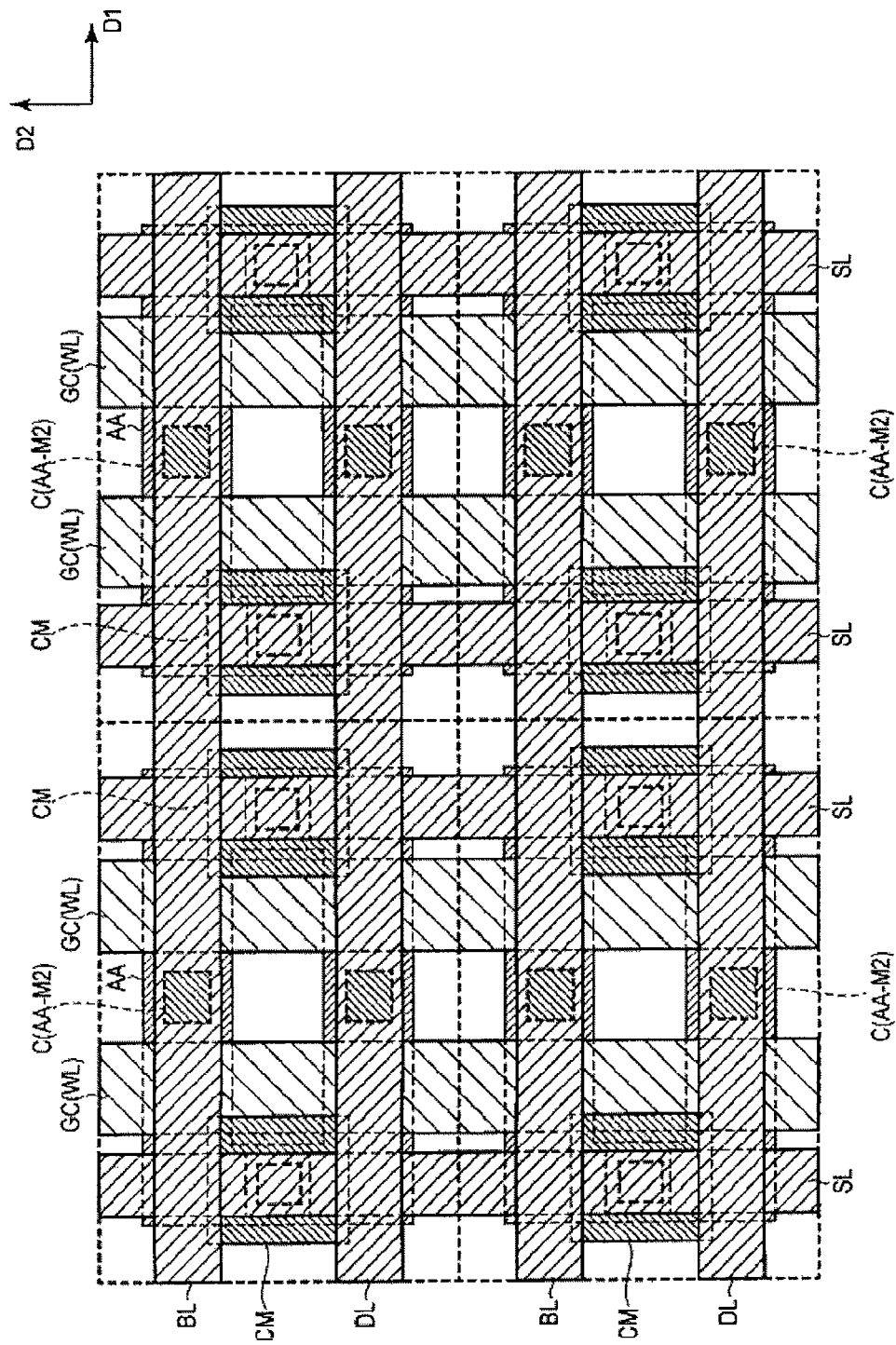
FIG. 26 shows a plan view of the memory cell array of the second embodiment.

FIG. 22 through FIG. 26 show the second embodiment. FIG. 22 shows the equivalent circuit of the memory cell; FIG. 23 through FIG. 25 show the cell layout and the cell configuration; and FIG. 26 shows an example of the cell array with four cells, arranged 2×2. FIG. 24 and FIG. 25 are cross sections of FIG. 23, along the A-A' and B-B' lines. This embodiment is substantially the same as the first embodiment. Operational examples and effects are also substantially the same. The difference in the second embodiment from the first embodiment is in the position of the source line SL, which is aligned in the same direction as the word line WL. Driver and sinker of the source line SL will be positioned either above or below the array as the row decoder.

With the first and second embodiments, it is possible to provide a resistance-change type non-volatile semiconductor memory which can enhance the operational reliability. In other words, the embodiment relates to a resistance-change type semiconductor memory, which reads data by changing the state of the memory element, using the property that the resistance of the element changes. In particular, the embodiment relates to magnetic resistance change memory (Magnetic RAM, MRAM, Spin-Transfer Torque MRAM), phase change memory (Phase Change RAM, Phase Change Memory, PRAM, PCM), and resistance change memory (Resistive RAM, Resistance Change Memory, RRAM®, ReRAM). The embodiments employ a memory element and make it possible: to prevent fluctuations of the cell transistor (Tr), which applies cell write and cell read currents, and prevent the deterioration of cell signals due to the resistance voltage drop during read and write lines; to receive large cell signals while restraining the cell Tr size; to prevent fluctuations of the cell transistor (Tr) and fluctuations in the write voltage applied to the actual cell element due to the resistance voltage drop in the read or write line; to expand the margin between the memory element and the breakdown voltage; and to enhance reliability and write stability by increasing the write voltage.

The effects of the embodiments will be explained in detail below. Today, semiconductor memories are used in many applications, such as main memory of large computers, personal computers PC, consumer electronics, and cell phones. Several types of semiconductor memory, such as volatile DRAM (Dynamic RAM) and SRAM (Static RAM), non-volatile MROM (Mask ROM), NAND flash memory, and Flash EEPROM such as NOR flash memory and so on, can be found on the market. DRAM is superior in its low cost (compared to SRAM, its cell area is less than one-fourth), and its speed (faster than Flash EEPROM), despite the fact that it is volatile memory. It has a large share in the PC and cell-phone markets. On the other hand, Flash EEPROM, which is non-volatile and can be rewritten and switched off, has been gaining a large market in recent years for cell-phones, various cards, SSD, and so on. However, it can be rewritten for only about from $10^6$ to $10^3$ times (the number of writes and erases), needs microseconds to milliseconds for the write time, needs high voltage, from 12 V to 22 V, and has problems in size reduction and performance.

On the other hand, as shown in FIG. 27, in recent years, emerging memory (new memory), such as a strong dielectric memory (FeRAM), a magnetic resistance memory (MRAM), a phase change memory (PRAM), a resistance change memory (RRAM) and so on, has been vigorously developed. Among them, MRAM and PRAM, which execute bipolar operations, change the amount and polarity of the current and voltage written into the memory cell, and write 1,0 information into the memory cell. During read, they apply a current to the resistance memory element, detect the amount of resistance change, and read 1,0 information. Also, PRAM and RRAM, which execute unipolar operations, change the amount of current and voltage written into the memory cell, and write 1,0 information into the memory cell. During read, they apply a current to the resistance memory element, detect the amount of resistance change, and read 1,0 information.

Figure 28:
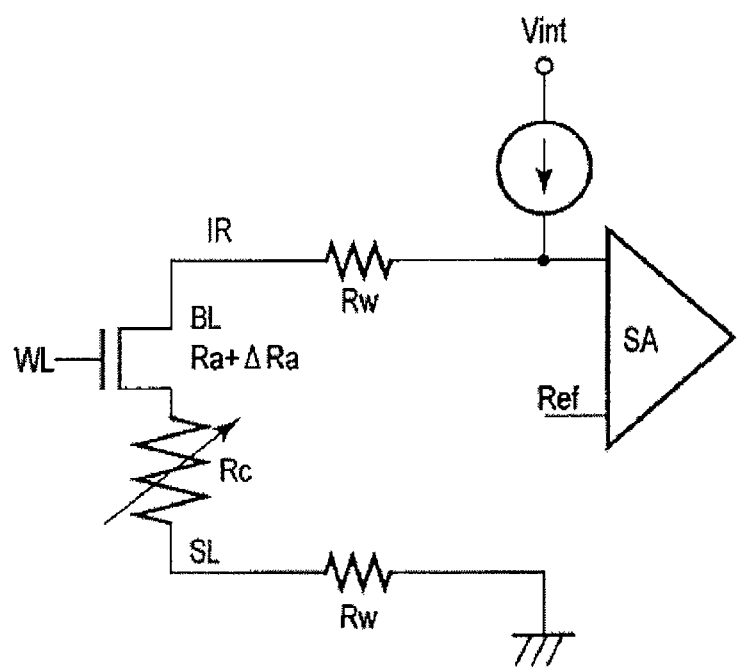
FIG. 28 shows the problems during the read operation by conventional resistance-change type memories.
Figure 29:
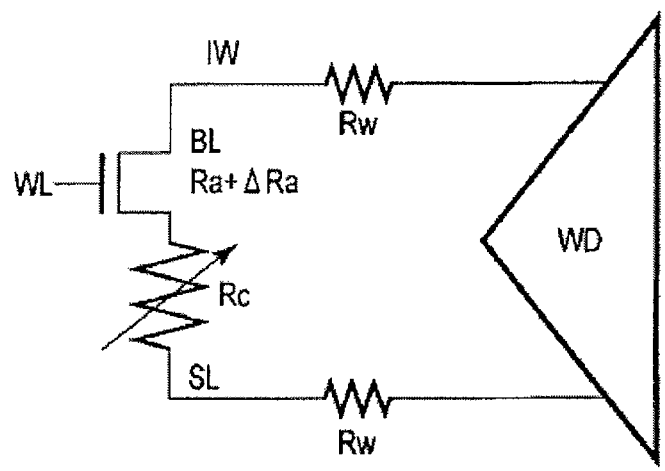
FIG. 29 shows the problems in the write operation by conventional resistance-change type memories.
Figure 30A:
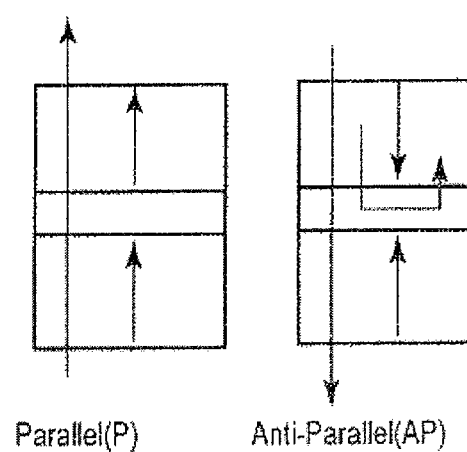
FIGS. 30A and 30B show an example of a conventional spin-injection type magnetic memory.
Figure 30B:
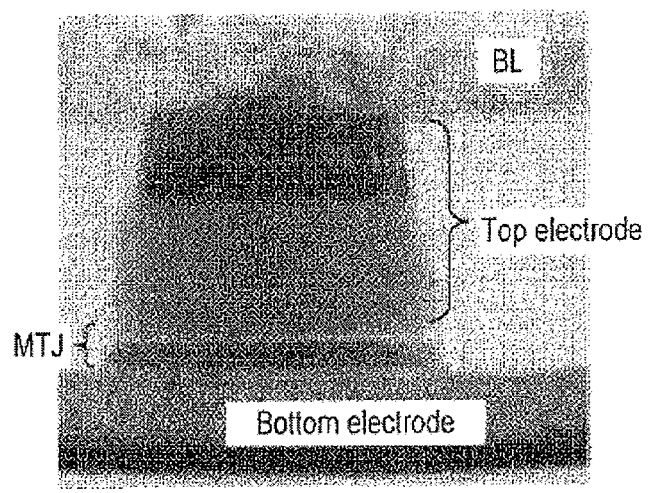
Figure 31A:
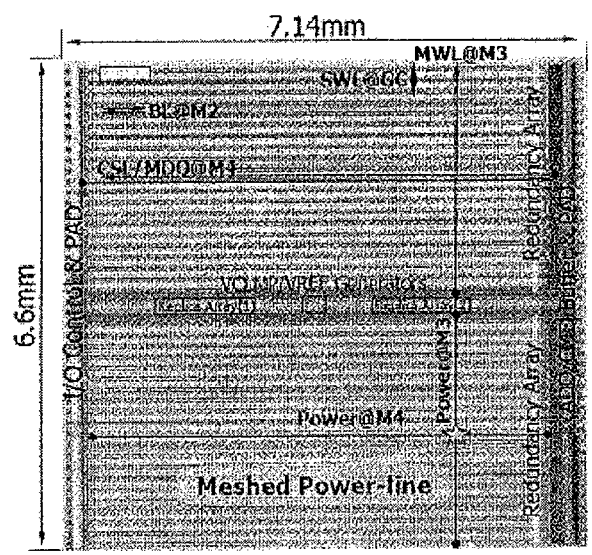
FIGS. 31A to 31D show an example of a conventional spin-injection type magnetic memory.
Figure 31B:
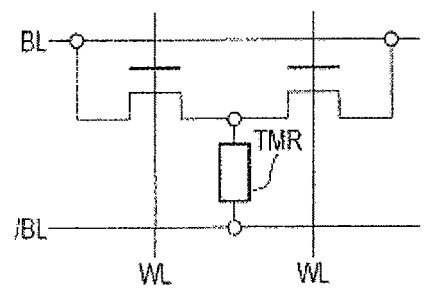
Figure 31C:
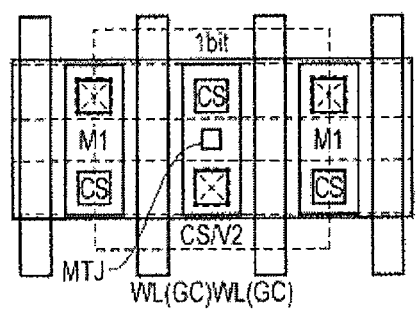
Figure 31D:
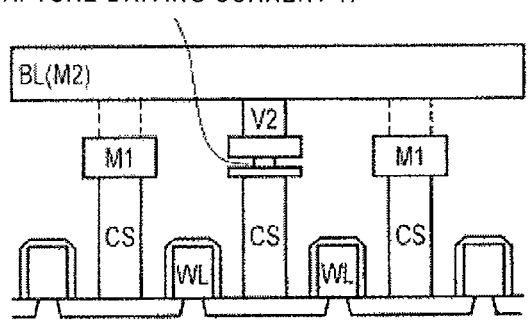

These memories have had the following problems. FIG. 28 shows an equivalent circuit during read and FIG. 29 shows an equivalent circuit during write. The resistance change element has a resistance Rc, and the resistance-change element in this illustration can be applied to any of MRAM, RRAM, and PRAM. During read, if the current IR is supplied to the bit line BL, the value of Rc will change according to the memory information of the resistance-change element, so the electric potential difference at both ends of the resistance-change element becomes different, and this difference will be read. The resistance of the cell transistor Ra has a fluctuation ΔRa, and a voltage difference is generated between the source and drain terminals of the cell transistor, which causes fluctuations. In this way, noise other than the electrical potential of the resistance-change element occurs, which significantly deteriorates the signal. Furthermore, if the location of the memory cell in the cell array is different, or if there are process fluctuations, the amount of voltage drop due to resistance at the bit line BL and the source line SL change, which also introduces noise. The resulting problem is that the potential difference between the bit line BL and the reference Ref becomes small. On the other hand, in the write operation shown in FIG. 29, even if a constant voltage is generated from the write circuit (WD) between the bit line BL and the source line SL, fluctuations of the driving current of the cell transistor and fluctuations of the wiring resistance occur. The voltage actually applied to the resistance-change element thus fluctuates, which causes fluctuations of time during write. Furthermore, due to the fluctuations, if the write voltage matches the small one and the write voltage of the large resistance-change element is determined, there will be a cell with a large write voltage. So, the problem is that the large write voltage exceeds the possible pressure-resistance in terms of reliability of the resistance-change element or that the margin between them decreases.

FIGS. 30A and 30B and FIGS. 31A to 31D show examples of a spin-injection MRAM. In order to reduce the signal deterioration due to fluctuations of the cell transistor, there is no other way than to increase the size of the cell transistor and reduce the drain-source voltage of the cell transistor. In the examples shown in FIGS. 30A and 30B and FIGS. 31A to 31D two cell transistors are connected in parallel to increase the driving current to thereby ameliorate this problem.

Figure 32A:
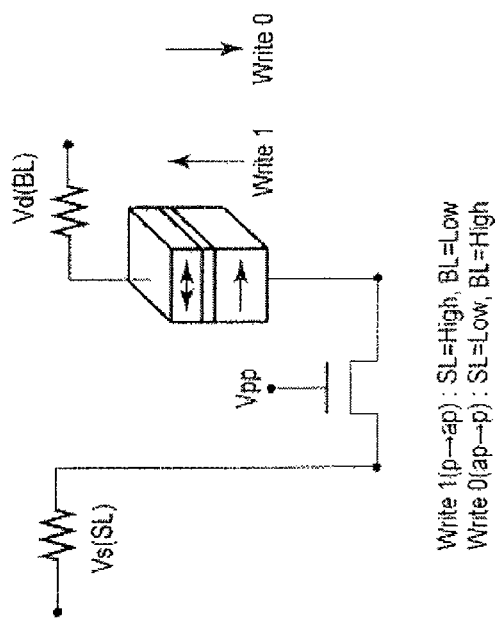
FIGS. 32A and 32B show an operational example of a conventional spin-injection type magnetic memory.
Figure 32B:
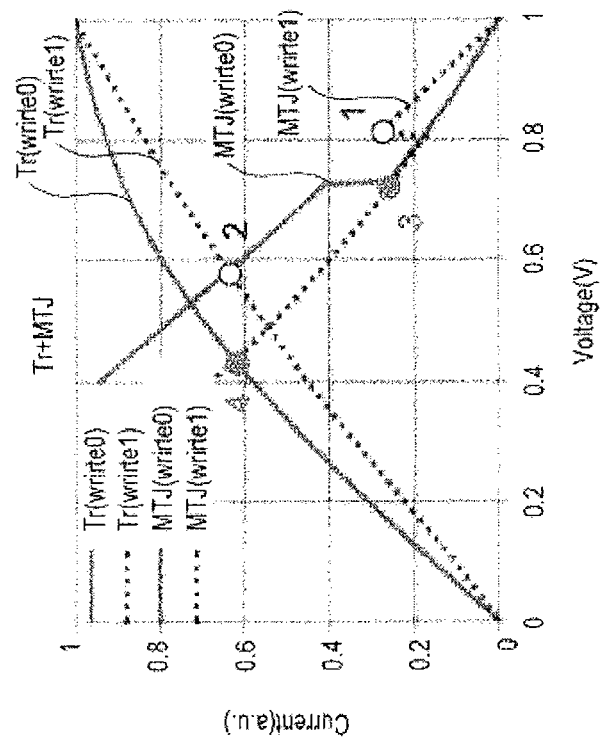

FIGS. 32A and 32B show the relation between a voltage applied to the MRAM element and a voltage applied to the cell transistor when a voltage of 1.5 V is applied to the bit line BL and the source line SL. This example shows that approximately half of the total voltage is applied to the cell transistor.

In this way, if the voltage difference between the source and the drain is high, and the cell transistor fluctuates, accurate data cannot be read unless the resistance ratio of 1,0 of the resistance-change element in the cell during read is very high. Also, during write, if the cell transistor fluctuates, the voltage applied to the resistance-change element of the cell will fluctuate significantly.

Figure 33:
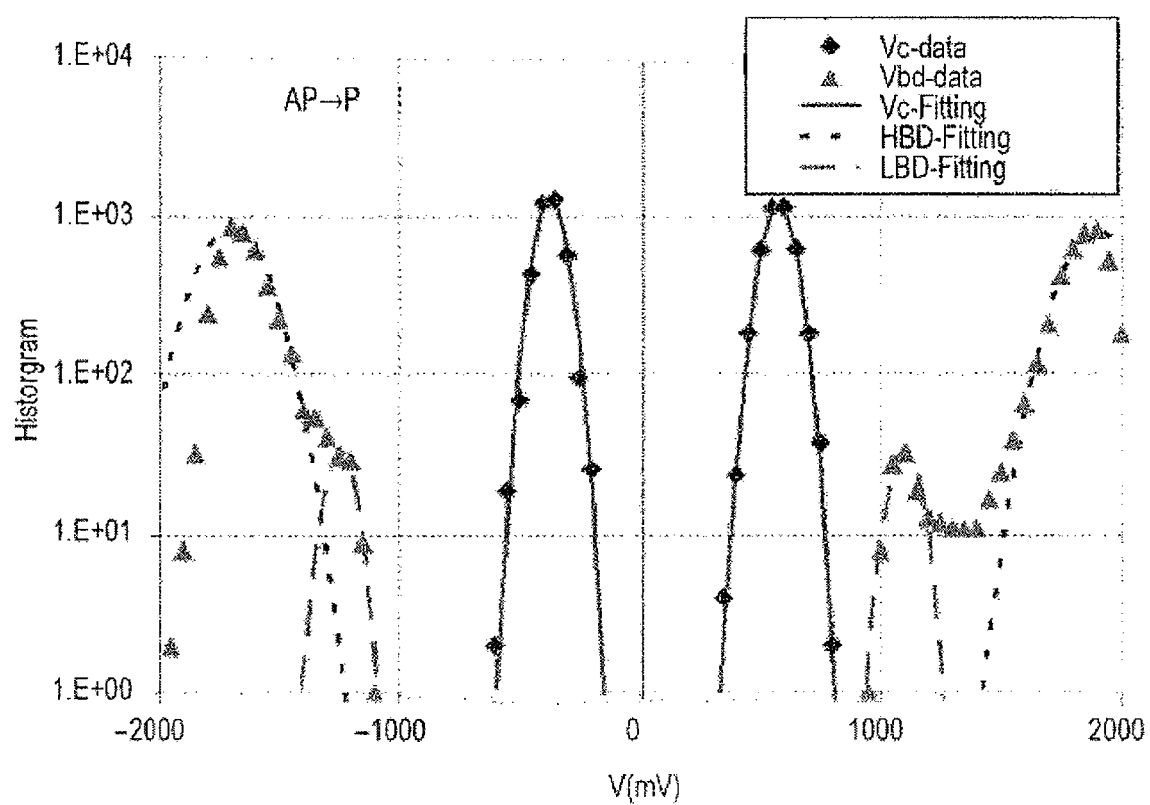
FIG. 33 shows a distribution of the write voltage and the breakdown voltage for a conventional spin-injection magnetic memory.

FIG. 33 shows the distributions of the write voltage and the breakdown voltage of each of 1, 0 data for the spin-injection MRAM. For write operations in which spin changes from parallel (P) to anti-parallel (AP), if there is no margin between the write voltage and the breakdown voltage Vdc, and there are fluctuations at the cell transistor, the distribution of the write voltage becomes broad and overwraps with the breakdown voltage. As a result, there will be no workable solution.

Figure 34:
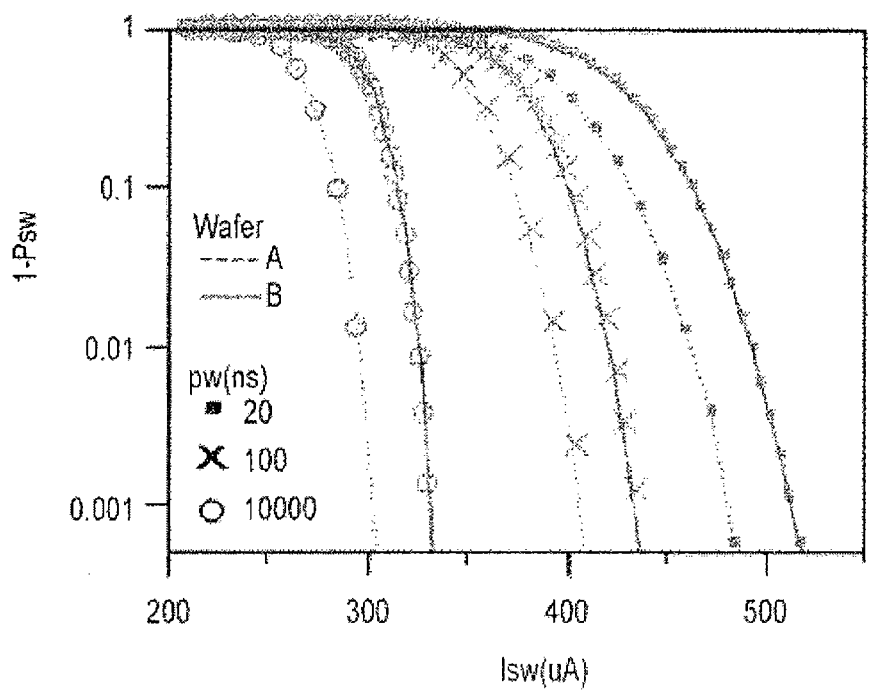
FIG. 34 shows a correlation diagram between the write time and the necessary write voltage for a conventional spin-injection magnetic memory.

Furthermore, as shown in FIG. 34, in the spin-injection MRAM, there is a strong correlation between the write voltage and the breakdown voltage. As a result, in order to write at a high speed, the write voltage becomes high, so the margin relative to the breakdown voltage will be further eroded.

Figure 35:
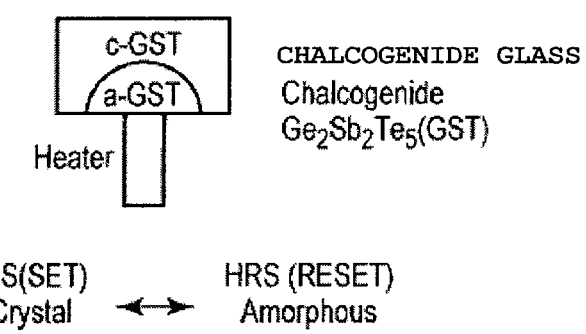
FIG. 35 shows an example of a conventional phase-change memory.
Figure 36:
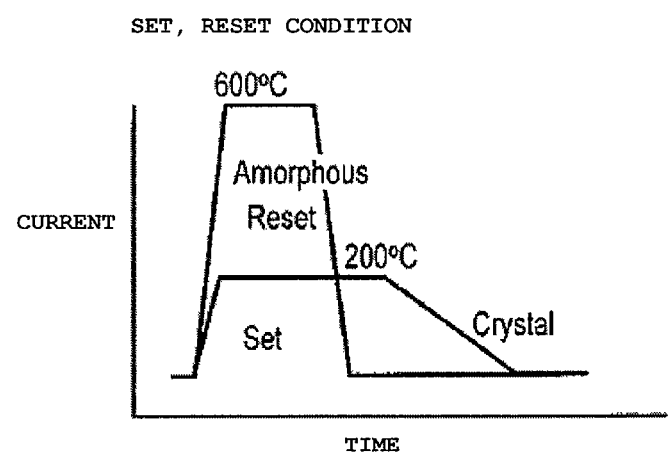
FIG. 36 shows an example of a conventional phase-change memory.
Figure 37:
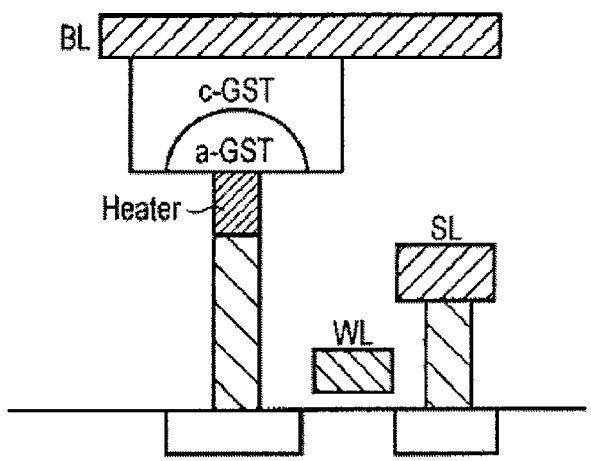
FIG. 37 shows an example of a conventional phase-change memory.
Figure 38:
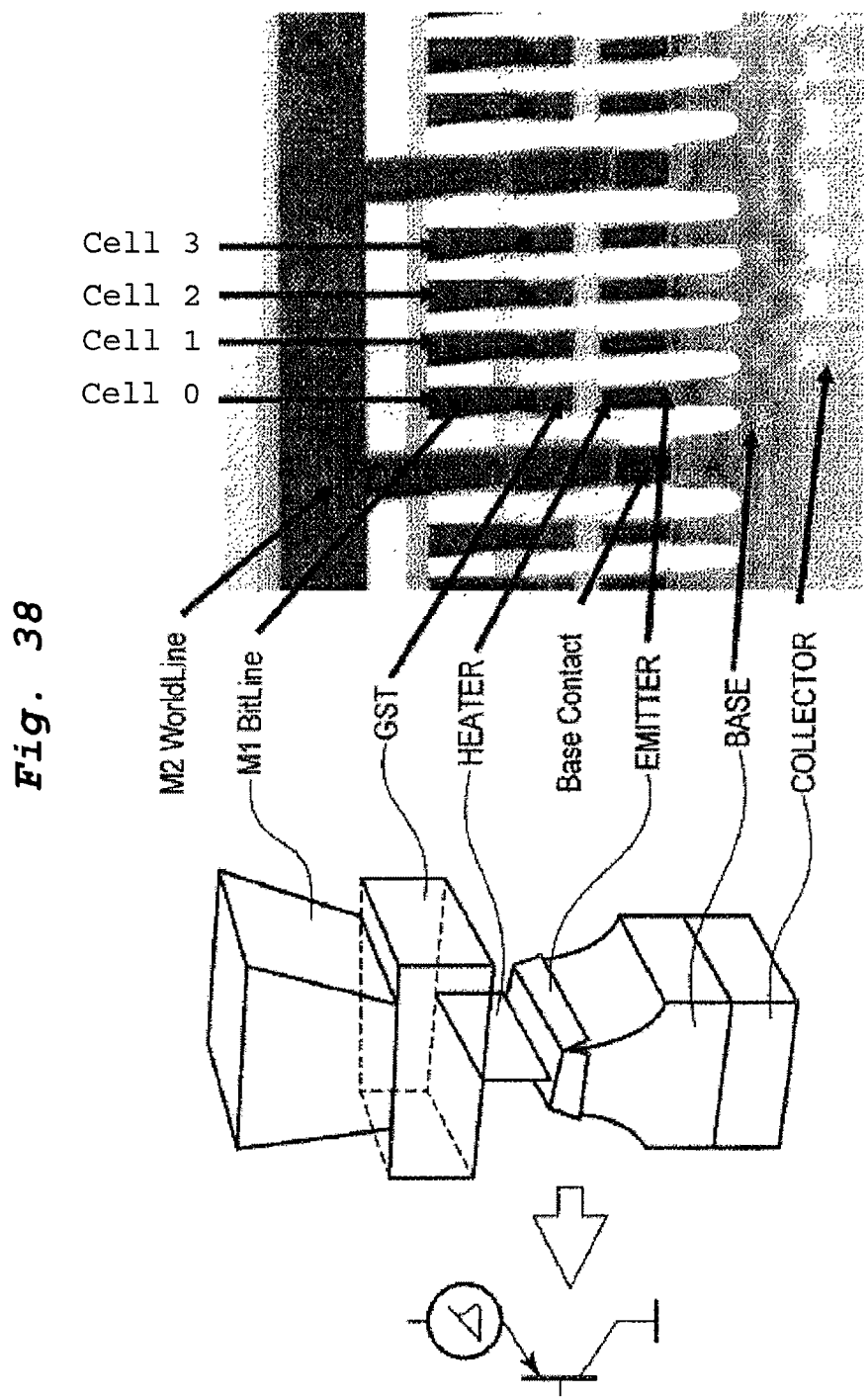
FIG. 38 shows an example of a conventional phase-change memory.
Figure 39:
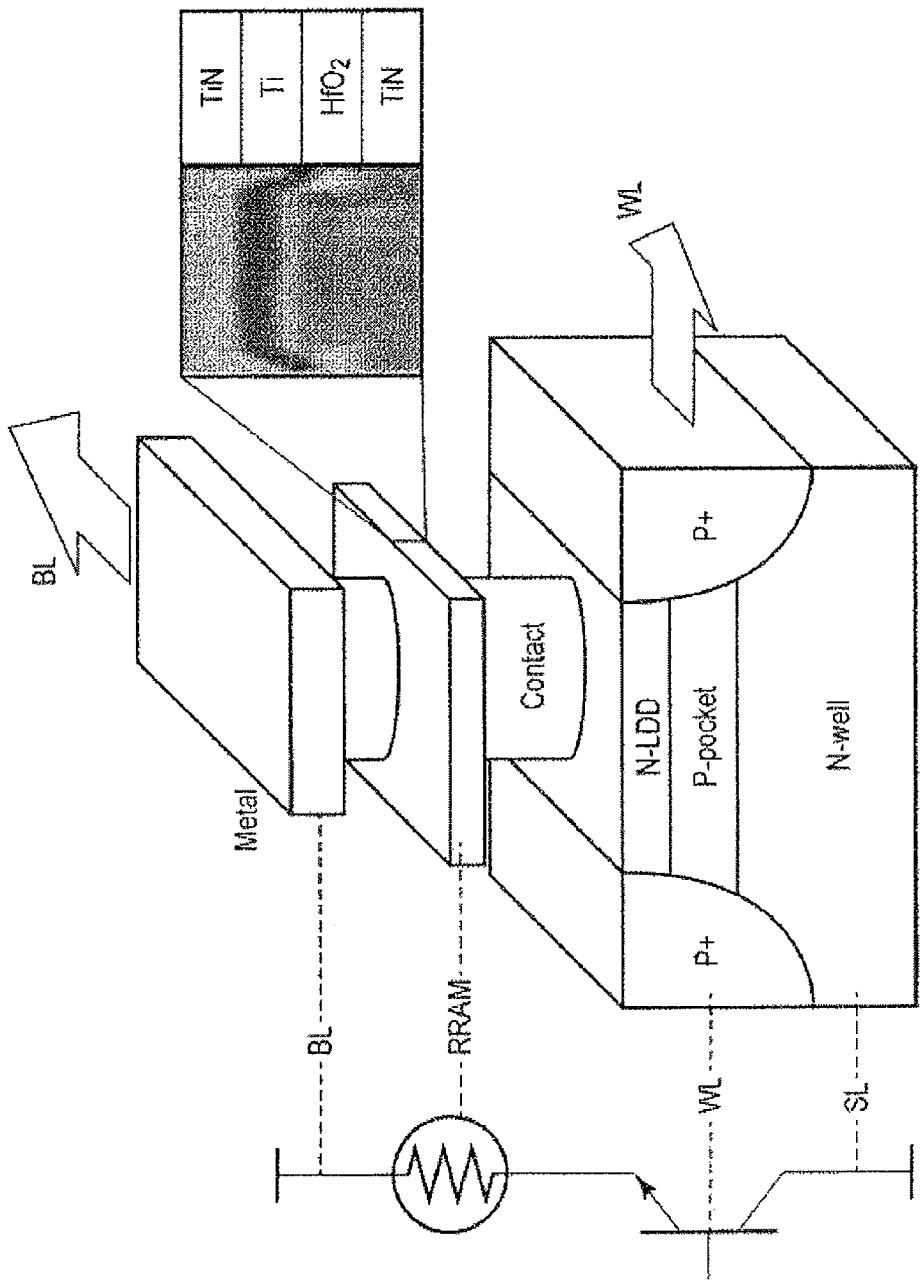
FIG. 39 shows an example of a conventional resistance-change memory.

FIG. 35 shows a configuration of the PRAM element, using chalcogenide materials. FIG. 36 shows the timing of the write operation. FIG. 37 shows an example of the cell configuration. In PRAM as well, the write cell current and read cell current are also large, currently at about 100 μA, and the same problems as with MRAM occur. As one solution, as shown in FIG. 38, many examples using a bipolar transistor, which has a larger driving current than the transistor, have been published. Of course, in the bipolar transistor, the problem of fluctuations between the base and emitter occurs, and if bipolar transistor is used, the process cost will increase. Similarly, FIG. 39 shows an example, similarly in the case of RRAM, in which a bipolar transistor is used to provide the driving current of the selected element of the cell.

Figure 40:
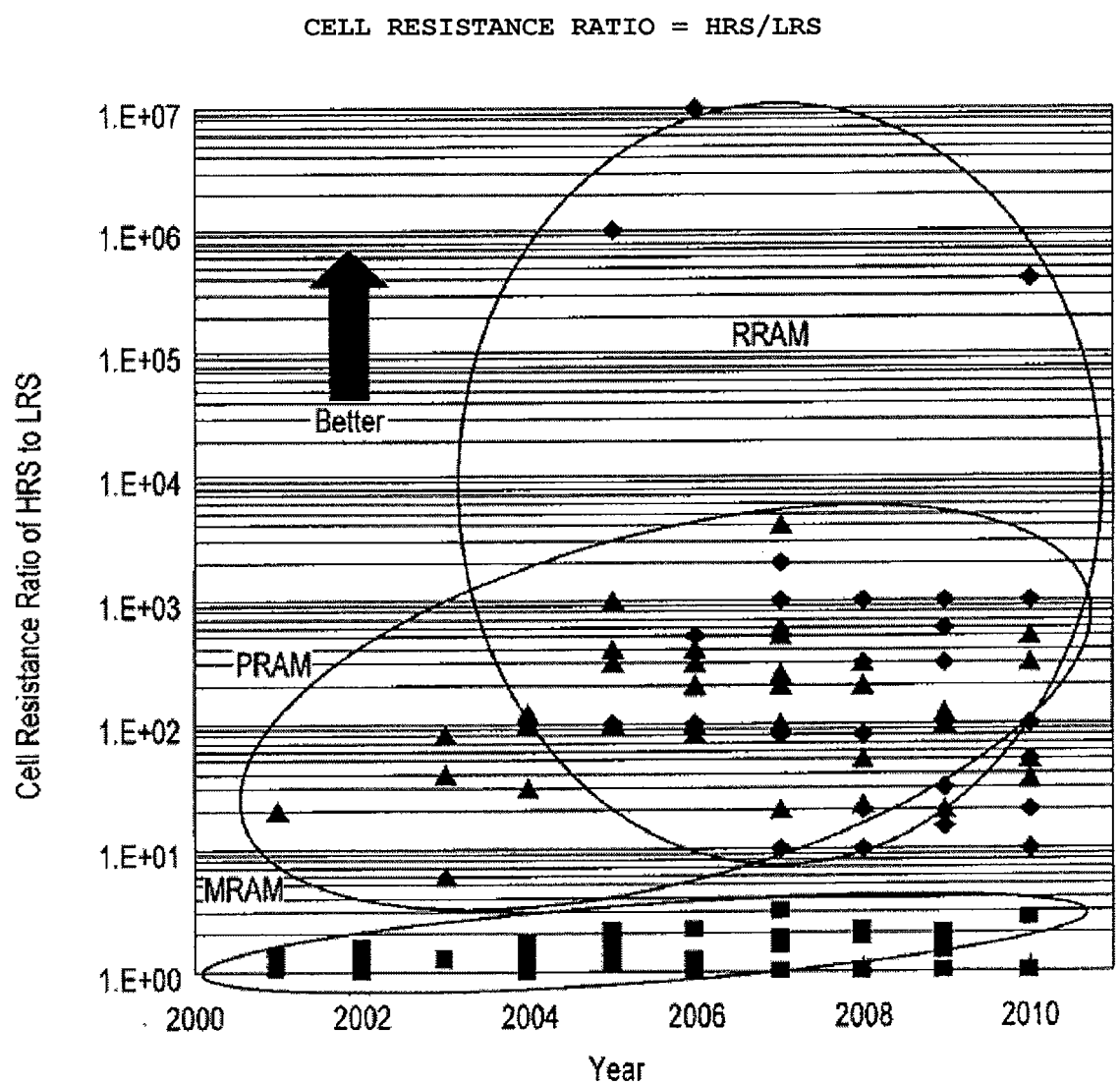
FIG. 40 shows trends in the resistance ratio of a cell in various resistance-change memories.

FIG. 40 shows the trend in the resistance ratio of the 1,0 data of the resistance memory element in the cell. MRAM has the smallest resistance ratio for 0, so fluctuations of the cell transistor and the effect caused by the signal deterioration by the wiring resistance are large. Also, the problem of margin erosion between the breakdown voltage and the write voltage can occur not only in MRAM but also in RRAM and PRAM.

In this way, in non-volatile memories which use the conventional resistance-change element (MRAM, RRAM, PRAM), a problem occurred in which the read voltage and current from the resistance-change element appear to be deteriorated because of fluctuations of the cell transistor resistance and a voltage drop due to the wiring resistance. In order to avoid this problem as much as possible, conventional solutions increased the size of the cell transistor, which became another problem. Furthermore, there have been problems in that the voltage applied to the resistance-change element fluctuates because of fluctuations of the cell transistor resistance and because of a voltage drop due to the wiring resistance, decreasing the margin relative to the breakdown voltage, and in that fluctuations in the time for write became large.

The configuration of this embodiment can solve the problems. In order to solve the problems, this embodiment adopts the following features. They include:

(1) The resistance-change type non-volatile semiconductor memory of this embodiment forms one memory cell with a first electrode and second electrode; a resistance-change element VR, which is interposed between the first and second electrodes and can store resistance changes representing 2 or more different values; and first cell transistor CT1 and second cell transistor CT2, with the source terminal of the first transistor CT1 and the source terminal of the second cell transistor CT2 being connected to the first electrode, the gate terminals of the first and second cell transistors CT1, CT2 being connected to the word line WL, the drain terminal of the first cell transistor CT1 being connected to the bit line BL, the drain terminal of the second cell transistor CT2 being connected to data line DL, and the second electrode of the resistance-change element VR being connected to the source line SL. A memory cell array is constructed by multiply positioning these units. During the read operation of memory cell data, the first and second cell transistors CT1 and CT2 are put in the ON state, and a current is supplied from the bit line BL to the source line SL through the memory cell. The data written in the memory cell are read based on the electrical potential difference between the data line DL and the source line SL (FIG. 10 and FIG. 11)

(2) The configuration described above in (1) puts the first and second cell transistors CT1 and CT2 in the ON state during the write operation of memory cell data, keeps bit line BL and the data line DL at the same electrical potential, applies a voltage difference between the bit line BL and the source line SL to supply a current to the resistance-change element VR, and changes the amount of current and polarity of the current to store data having one of 2 or more different different values at the resistance-change element (FIG. 12 and FIG. 13).

(3) The configuration mentioned above in (1), during the write operation of the memory cell data, puts the first and second cell transistors CT1 and CT2 in the ON state, applies a voltage difference between the bit line BL and the source line SL to supply a current to the resistance-change element VR, changes the amount of the current and polarity of the current, stores data having one of two or more different values at the resistance-change element VR, and controls the voltage applied to the bit line BL so that the write electric potential difference between the first electrode and the second electrode of the resistance-change element VR becomes constant (FIG. 14 and FIG. 15).

(4) In the configuration described above in (1), the data line DL and the source line SL are positioned up to both ends of the cell array; the source line SL is pulled down to a specified voltage in the sinker circuit at one end of the cell array; and the data line DL and the source line SL are connected to the amplifier circuit, which reads data, at the other end of the cell array (FIG. 18).

(5) In the configuration described above in (3), the bit line BL is connected to the first write circuit D1; the data line DL and the source line SL are positioned up to both ends of the cell array; the source line SL is connected to the second write circuit D2 at one end of the cell array; and the data line DL and the source line SL monitor the voltage applied to the resistance-change element VR at the other end of the cell array and control the electrical potential difference between the bit line BL and the source line SL, which is generated from the first and second write circuits D1 and D2 so that the voltage applied to the resistance-change element VR is kept constant. (FIG. 14 through FIG. 17)

(6) In the configuration described above in (1) through (5), the resistance-change element VR is formed as a structure in which the tunnel film is interposed between two different magnetic materials.

(7) In the configuration described above in (1) through (5), the resistance-change element VR is formed by connecting chalcogenide materials which include such elements as Ge, Sb, Te and so on, in series with the heater element.

(8) In the configuration described above in (1) through (5), the resistance-change element VR is formed as a structure in which binary metallic oxides, ternary metallic oxides, chalcogenide materials with metallic electrons mixed in, or perovskite oxides, are interposed between metallic electrodes.

According to the configuration described above in (1), a current is supplied between the bit line BL and the source line SL, and the electric potential at both ends of the resistance-change element VR is read as the voltage difference between the data line DL and the source line SL; therefore, there is no problem even if the voltage difference between the source and the drain of the first cell transistor CT1, in which a current flows, fluctuates. On the other hand, the data line DL is connected to the signal detection circuit SA, and can be kept in the high-impedance state, so once the electrical potential of the data line DL is stabilized, there will be no current in the second cell transistor CT2 and a voltage drop will not occur. For this reason, data can be read without being affected by fluctuations of the cell transistors CT1 and CT2 with the voltage at both ends of the resistance-change element in the cell being the voltage difference between the data line DL and the source line SL.

According to the configuration described above in (2), during the write operation, data can be written into the cell by driving both the first cell transistor CT1 and the second cell transistor CT2.

According to the configuration described above in (3), it is possible to apply a current between the bit line BL and the source line SL, and to read the electric potential of both ends of the resistance-change element VR as the voltage difference between the data line DL and the source line SL, while writing data into the resistance-change element VR. If this voltage is small, a greater voltage is applied to the bit line BL. Once this voltage reaches the desired voltage, by keeping the voltage applied to the bit line BL constant, even if the voltage difference between the source and the drain of the first cell transistor CT1, in which a current flows, fluctuates, or the resistance of the bit line BL changes, it is possible to apply a constant voltage to the resistance-change element VR of the cell, to restrain fluctuations of the write speed, and to maintain a greater margin in the pressure resistance for reliability of the resistance-change element in the cell.

According to the configuration described above in (4) and (5), even if there is a current in the source line SL, that current will flow on the side of the driver circuit, and there will be no current to the source line SL on the other side to the selected cell of the cell array. Therefore, it is possible to accurately read the electrical potential difference of the cell ends, accurately read the cell signals during the read operation and the voltage applied to the resistance-change element of the cell during the write operation, and prevent a voltage drop due to the resistance of the source line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change memory comprising memory cells, the memory cell comprising:
   a resistance-change element, which is interposed between first and second electrodes; and
   first and second cell transistors,
   wherein source terminals of the first and second cell transistors are connected to the first electrode, gate terminals of the first and second cell transistors to a word line, a drain terminal of the first cell transistor to a bit line, a drain terminal of the second cell transistor to a data line, and the second electrode to a source line, and
   wherein an impedance level of the data line is higher than that of the bit line and that of the source line.

2. The memory according to claim 1, wherein the resistance-change element is formed to have a tunnel film interposed between different magnetic materials.

3. A resistance-change memory, comprising:
   a plurality of memory cells, each memory cell includes:
      a resistance-change element, which is interposed between first and second electrodes, the second electrode connected to a source line; and
      first and second cell transistors having source terminals thereof connected to the first electrode and gate terminals thereof connected to a word line, a drain terminal of the first cell transistor connected to a bit line, and a drain terminal of the second cell transistor being connected to a data line,
   wherein two of the word lines in the resistance-change memory are connected to either a first memory cell or a second memory cell, and each word line crosses a data line that is connected to the first memory cell and the second memory cell.

4. The resistance-change memory according to claim 3, wherein a read operation causes the first and second cell transistors to be in an ON state, and a current to be supplied from the bit line to the source line through the memory cell, and wherein the data written in the memory cell is read based on a voltage difference between the data line and the source line.

5. The resistance-change memory according to claim 3, wherein a write operation causes the first and second cell transistors to be in an ON state, the bit line and the data line to be at the same electrical potential, and a current to be supplied to the resistance-change element.

6. The resistance-change memory according to claim 5, wherein the current is supplied to the resistance-change element by applying a voltage difference between the bit line and the source line.

7. The resistance-change memory according to claim 6, wherein the amount of the current and polarity of the current are changed to store data having one of the 2 or more different values at the resistance-change element.

8. The resistance-change memory according to claim 3, wherein a write operation causes the first and second cell transistors to be in an ON state, a current to be supplied to the resistance-change element, and a write electric potential difference between the first electrode and the second electrode of the resistance-change element to be kept constant.

9. The resistance-change memory according to claim 8, wherein the current is supplied to the resistance-change element by applying a voltage difference between the bit line and the source line, and the amount of the current and polarity of the current are changed to store data having the one of the 2 or more different values at the resistance-change element.

10. The resistance-change memory according to claim 9, wherein the write electric potential difference between the first electrode and the second electrode of the resistance-change element is kept constant by controlling the voltage applied to the bit line.

11. The resistance-change memory according to claim 10, further comprising:
    a first write circuit connected to the bit line; and
    a second write circuit connected to the source line.

12. The resistance-change memory according to claim 11, wherein the data line and the source line monitor the voltage applied to the resistance-change element to keep the voltage applied to the resistance-change element constant.

13. The resistance-change memory according to claim 3, further comprising:
    a sinker circuit and
    an amplifier circuit connected to the data line and the source line.

14. The resistance-change memory according to claim 3, wherein the resistance-change element includes a heater element.

15. The resistance-change memory according to claim 3, wherein the resistance-change element is formed from one of binary metallic oxides, ternary metallic oxides, a material in which metallic electrons are intermixed with a chalcogenide material, and a structure in which perovskite oxides are interposed between metallic electrodes.

16. The resistance-change memory according to claim 3, wherein the first memory cell and the second memory cell are arranged adjacently.

17. The resistance-change memory according to claim 3, further comprising:
    a first write circuit connected to the bit line; and
    a second write circuit connected to the source line.

18. A resistance-change memory comprising:
    a first memory cell connected to a first word line, a first bit line, a first source line, and a first data line;
    a second memory cell connected to a second word line, the first bit line, the first source line, and the first data line;
    a third memory cell connected to the first word line, a second bit line, a second source line, and the second data line; and
    a fourth memory cell connected to the second word line, the second bit line, the second source line, and a second data line,
    wherein each of the memory cells includes a resistance-change element interposed between a first electrode and a second electrode which is connected to a corresponding source line, and first and second cell transistors having source terminals thereof connected to the first electrode and gate terminals thereof connected to a corresponding word line, and wherein a drain terminal of the first cell transistor is connected to a corresponding bit line, and a drain terminal of the second cell transistor is connected to a corresponding data line, and wherein the first word line and the second word line cross the first data line.

19. The resistance-change memory according to claim 18, wherein the first memory cell and the second memory cell are arranged adjacently.

20. The resistance-change memory according to claim 18, wherein each of the first word line and the second word line are arranged to intersect with the second data line.

21. The resistance-change memory according to claim 20, wherein the first memory cell and the second memory cell are arranged adjacently.

* * * * *